(12) United States Patent
Ikeda et al.

(10) Patent No.: US 11,108,378 B2
(45) Date of Patent: Aug. 31, 2021

(54) METHOD OF MANUFACTURING QUARTZ CRYSTAL RESONATOR AND QUARTZ CRYSTAL RESONATOR UNIT

(71) Applicant: Murata Manufacturing Co., Ltd., Nagaokakyo (JP)

(72) Inventors: Isao Ikeda, Nagaokakyo (JP); Motonori Matsushita, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 236 days.

(21) Appl. No.: 16/577,203

(22) Filed: Sep. 20, 2019

(65) Prior Publication Data

US 2020/0014359 A1 Jan. 9, 2020

Related U.S. Application Data

(63) Continuation of application No. 16/576,909, filed on Sep. 20, 2019, which is a continuation of application No. PCT/JP2018/018672, filed on May 15, 2018.

(30) Foreign Application Priority Data

May 15, 2017 (JP) .............................. JP2017-096648

(51) Int. Cl.
*H03H 9/19* (2006.01)
*H03H 9/10* (2006.01)
(Continued)

(52) U.S. Cl.
CPC ................ *H03H 9/19* (2013.01); *H03H 3/02* (2013.01); *H03H 9/10* (2013.01); *H03H 9/13* (2013.01)

(58) Field of Classification Search
CPC .. H03H 9/19; H03H 9/02; H03H 9/10; H03H 9/13; H03H 9/1035; H03H 9/0595
See application file for complete search history.

(56) References Cited

U.S. PATENT DOCUMENTS 6,191,524 B1 * 2/2001 Sasaki .................... H03H 9/132
310/367
2009/0108709 A1 4/2009 Tsuchido
(Continued)

FOREIGN PATENT DOCUMENTS

JP 2011166352 A 8/2011
JP 2015019240 A 1/2015
(Continued)

OTHER PUBLICATIONS

International Search Report issued for PCT/JP2018/018672, dated Jul. 31, 2018.

*Primary Examiner* — Jeffrey M Shin
(74) *Attorney, Agent, or Firm* — Arent Fox LLP

(57) ABSTRACT

A method of forming a quartz crystal resonator is provided with the resonator including a body portion with first and second main surfaces facing each other and, in plan view having a pair of long sides extending in a first direction and a pair of short sides extending in a second intersecting direction. Moreover, first and second excitation electrodes are formed on the respective main surfaces; a frame surrounds the body portion at both ends and is separated from the both ends; and first and second coupling portions extend from the short sides and with widths of the short sides. At least one of the first and second coupling portions is formed with a thickness in a third direction is smaller than a thickness in the third direction of a region of the body portion where the first excitation electrode and the second excitation electrode face each other.

20 Claims, 8 Drawing Sheets

(51) Int. Cl.
*H03H 9/13* (2006.01)
*H03H 3/02* (2006.01)

(56) References Cited

U.S. PATENT DOCUMENTS

| | | | |
|---|---|---|---|
| 2012/0242193 A1* | 9/2012 | Shimao | H03H 9/19 310/348 |
| 2015/0015119 A1 | 1/2015 | Takahashi et al. | |

FOREIGN PATENT DOCUMENTS

| | | | |
|---|---|---|---|
| JP | 2015070582 A | 4/2015 | |
| JP | 2016201624 A | 12/2016 | |
| WO | 2007023685 A1 | 3/2007 | |

* cited by examiner

METHOD OF MANUFACTURING QUARTZ CRYSTAL RESONATOR AND QUARTZ CRYSTAL RESONATOR UNIT

CROSS REFERENCE TO RELATED APPLICATIONS

The present application is a continuation U.S. patent application Ser. No. 16/576,909, filed Sep. 20, 2019, which is a continuation of PCT/JP2018/018672 filed May 15, 2018, which claims priority to Japanese Patent Application No. 2017-096648, filed May 15, 2017, the entire contents of each of which are incorporated herein by reference.

TECHNICAL FIELD

The present invention relates to a quartz crystal resonator and a quartz crystal resonator unit in each of which a quartz crystal blank and a quartz crystal frame body surrounding the quartz crystal blank are coupled to each other by quartz crystal coupling members, and to methods of manufacturing the quartz crystal resonator and the quartz crystal resonator unit.

BACKGROUND

In general, piezoelectric devices having a structure in which a piezoelectric chip is interposed between a lid and a base are widely used as piezoelectric devices used in an oscillation device, a band pass filter, and the like. For example, Patent Document 1 (identified below) describes a specific example of such a piezoelectric chip in which a vibration portion and a frame surrounding the vibration portion are coupled to each other by one coupling portion and with a through portion that is formed between the frame portion and a periphery of the vibration portion excluding the coupling portion. For example, the entirety of the piezoelectric chip is made by wet etching an AT-cut quartz crystal plate.

Patent Document 1: Japanese Unexamined Patent Application Publication No. 2016-201624.

Because a quartz crystal has an anisotropic crystal structure, the dissolution rate of wet etching differs in accordance with crystal orientation. Accordingly, when a quartz crystal substrate is wet etched, for example, in a step of forming a through portion, dissolution does not proceed in the normal line direction of a main surface of the quartz crystal substrate but proceeds with an inclination. Thus, in order to form a through portion along substantially the entire periphery of the vibration portion as described in Patent Document 1, depending on crystal orientation, it is necessary to provide a comparatively large distance between the vibration portion and the frame. That is, if the size of the piezoelectric chip is reduced in the conventional structure, the area of the vibration portion decreases and vibration characteristics may deteriorate. On the other hand, if providing an appropriate area to the vibration portion is prioritized, a problem arises in that the outer size of the piezoelectric chip increases.

SUMMARY OF THE INVENTION

Accordingly, the present invention has been made in such circumstances, and an object thereof is to provide a quartz crystal resonator and a quartz crystal resonator unit each of which can be reduced in size while suppressing deterioration of vibration characteristics. Moreover, methods are provided for manufacturing the quartz crystal resonator and the quartz crystal resonator unit.

According to an exemplary aspect of the present invention, a quartz crystal resonator is provided that includes a body portion that has a first main surface and a second main surface facing each other and that has, in plan view as seen from the first main surface side or the second main surface side, a pair of long sides that extend in a first direction and a pair of short sides that extend in a second direction that intersects the first direction. Moreover, a first excitation electrode is provided that is disposed on the first main surface; a second excitation electrode is provided that is disposed on the second main surface so as to face the first excitation electrode; a frame surrounds the body portion and is disposed, at both end portions of the body portion in the second direction, separated from the both end portions; a first coupling portion extends from one of the pair of short sides of the body portion in the first direction with a width of the short side and that couples the body portion and the frame to each other; and a second coupling portion extends from the other of the pair of short sides of the body portion in the first direction with a width of the short side and that couples the body portion and the frame to each other. In the exemplary aspect, the body portion, the frame, the first coupling portion, and the second coupling portion are each made of a quartz crystal. In addition, at least one of the first coupling portion and the second coupling portion has a portion whose thickness in a third direction is smaller than a thickness in the third direction of a region of the body portion where the first excitation electrode and the second excitation electrode face each other, with the third direction being a direction that intersects the first direction and the second direction.

A quartz crystal resonator according to another exemplary aspect of the present invention includes a body portion that has first and second main surfaces facing each other and that has, in plan view as seen from the first main surface side or the second main surface side, a pair of long sides that extend in a first direction and a pair of short sides that extend in a second direction that intersects the first direction. Moreover, the resonator includes a first excitation electrode that is disposed on the first main surface; a second excitation electrode that is disposed on the second main surface so as to face the first excitation electrode; a frame portion that has an inner side surface that is located so as to surround the body portion and an upper surface and a lower surface that are respectively located on an upper side and a lower side in a third direction that intersects the first direction and the second direction; a first coupling portion that extends in the first direction so as to couple one of the pair of short sides of the body portion to the inner side surface of the frame portion with a width of the short side and that has an upper surface and a lower surface that are respectively located on an upper side and a lower side in the third direction; and a second coupling portion that extends in the first direction so as to couple the other of the pair of short sides of the body portion to the inner side surface of the frame portion with a width of the short side and that has an upper surface and a lower surface that are respectively located on an upper side and a lower side in the third direction. Between both ends of the body portion in the second direction and the frame portion, a first through portion and a second through portion are formed so as to each extend over a length of the body portion, the first coupling portion, and the second coupling portion in the first direction. The first main surface and the second main surface are located between the upper surface and the lower surface of the frame portion in the third direction. The upper surface and the lower surface of the first coupling portion each have an inclined portion that is inclined upward in the third direction from the body portion toward the frame portion. Moreover, the upper surface and the lower surface of the second coupling portion each have an inclined portion that is inclined downward in the third direction from the body portion toward the frame portion.

In another exemplary aspect, a method of manufacturing a quartz crystal resonator is provided that includes (a) preparing a first substrate that is made of a quartz crystal that is AT-cut in such a way that, when an X-axis, a Y-axis, and a Z-axis are crystal axes of the quartz crystal and a Y'-axis and a Z'-axis are respectively axes that are obtained by rotating the Y-axis and the Z-axis around the X-axis by a predetermined angle in a direction from the Y-axis toward the Z-axis, surfaces of the quartz crystal that are defined by the X-axis and the Z'-axis are main surfaces. Moreover, the method includes (b) forming, by wet etching the first substrate, a body portion that has a first main surface and a second main surface facing each other and that has, in plan view as seen from the first main surface side or the second main surface side, a pair of long sides that extend in the Z'-axis direction and a pair of short sides that extend in the X-axis direction, a frame portion that surrounds the body portion, and a first coupling portion and a second coupling portion that couple the body portion and the frame portion to each other at both end portions of the body portion in the Z'-axis direction. The method further includes (c) forming a first excitation electrode on the first main surface and forming a second excitation electrode that faces the first excitation electrode on the second main surface. In the exemplary aspect, the step (b) includes separating both end portions of the body portion in the X-axis direction from the frame portion, extending the first coupling portion in the Z'-axis direction from one of the pair of short sides of the body portion with a width of the short side to reach the frame portion, extending the second coupling portion in the Z'-axis direction from the other of the pair of short sides of the body portion with a width of the short side to reach the frame portion, and making a thickness in the Y'-axis direction of at least a portion of at least one of the first coupling portion and the second coupling portion smaller than a thickness in the Y'-axis direction of a region of the body portion where the first excitation electrode and the second excitation electrode face each other.

In another exemplary aspect, a method of manufacturing a quartz crystal resonator is provided that includes (a) preparing a first substrate that is made of a quartz crystal that is AT-cut in such a way that, when an X-axis, a Y-axis, and a Z-axis are crystal axes of the quartz crystal and a Y'-axis and a Z'-axis are respectively axes that are obtained by rotating the Y-axis and the Z-axis around the X-axis by a predetermined angle in a direction from the Y-axis toward the Z-axis, surfaces of the quartz crystal that are defined by the X-axis and the Z'-axis are main surfaces. Moreover, the method includes (b) forming, by wet etching the first substrate, a body portion that has a first main surface and a second main surface facing each other and that has, in plan view as seen from the first main surface side or the second main surface side, a pair of long sides that extend in the Z'-axis direction and a pair of short sides that extend in the X-axis direction, a frame portion that has an inner side surface that is located so as to surround the body portion and an upper surface and a lower surface that are respectively located on an upper side and a lower side in the Y'-axis direction, a first coupling portion that extends in the Z'-axis direction so as to couple one of the pair of short sides of the body portion and the inner side surface of the frame portion to each other with a width of the short side and that has an upper surface and a lower surface that are respectively located on an upper side and a lower side in the Y'-axis direction, a second coupling portion that extends in the Z'-axis direction so as to couple the other of the pair of short sides of the body portion and the inner side surface of the frame portion to each other with a width of the short side and that has an upper surface and a lower surface that are respectively located on an upper side and a lower side in the Y'-axis direction, and a first through portion and a second through portion between both end portions of the body portion in the X-axis direction and the frame portion, the first and second through portions each extending over a length of the body portion, the first coupling portion, and the second coupling portion in the Z' axis direction. The method further includes (c) forming a first excitation electrode on the first main surface and forming a second excitation electrode that faces the first excitation electrode on the second main surface. According to the exemplary aspect, in step (b), the first main surface and the second main surface are located between the upper surface and the lower surface of the frame portion in the Y'-axis direction, an inclined portion is formed in each of the upper surface and the lower surface of the first coupling portion, the inclined portion being inclined upward in the Y'-axis direction from the body portion toward the frame portion, and an inclined portion is formed in each of the upper surface and the lower surface of the second coupling portion, the inclined portion being inclined downward in the Y'-axis direction from the body portion toward the frame portion.

According to the exemplary aspects of the present invention, a quartz crystal resonator and a quartz crystal resonator unit are provided that can have a reduced size while suppressing deterioration of vibration characteristics. Moreover, methods of manufacturing the quartz crystal resonator and the quartz crystal resonator unit are also provided.

DETAILED DESCRIPTION OF EMBODIMENTS

Hereinafter, exemplary embodiments of the present invention will be described. In the following descriptions related to the drawings, the same or similar elements are denoted by the same or similar numerals. It should be appreciated that the drawings are exemplary, the dimensions and the shapes of elements are schematic, and the technical scope of the present invention is not limited to the embodiments.

Figure 1:
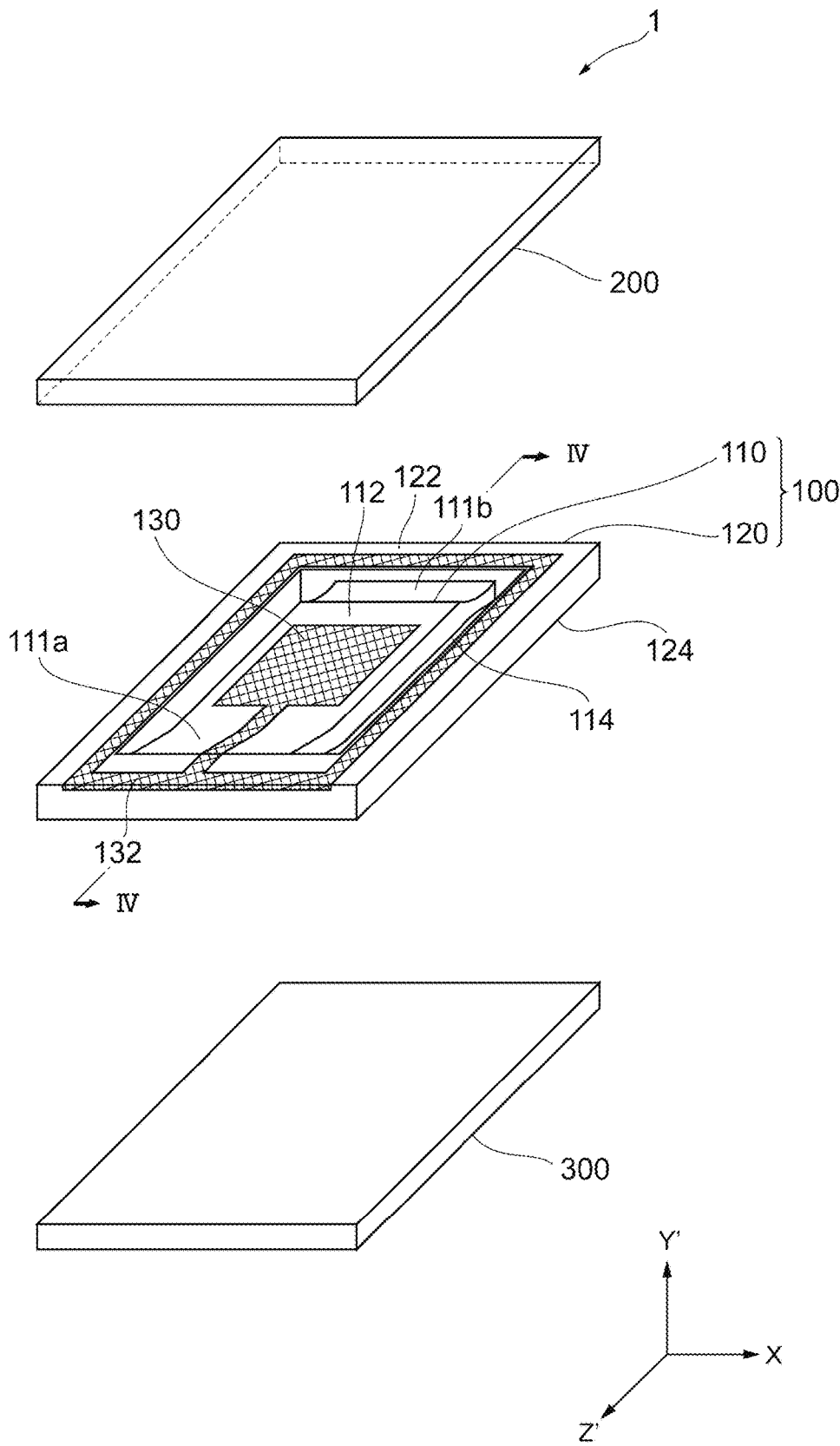
FIG. 1 is an exploded perspective view of a quartz crystal resonator unit 1 according to a first exemplary embodiment of the present invention.
Figure 2:
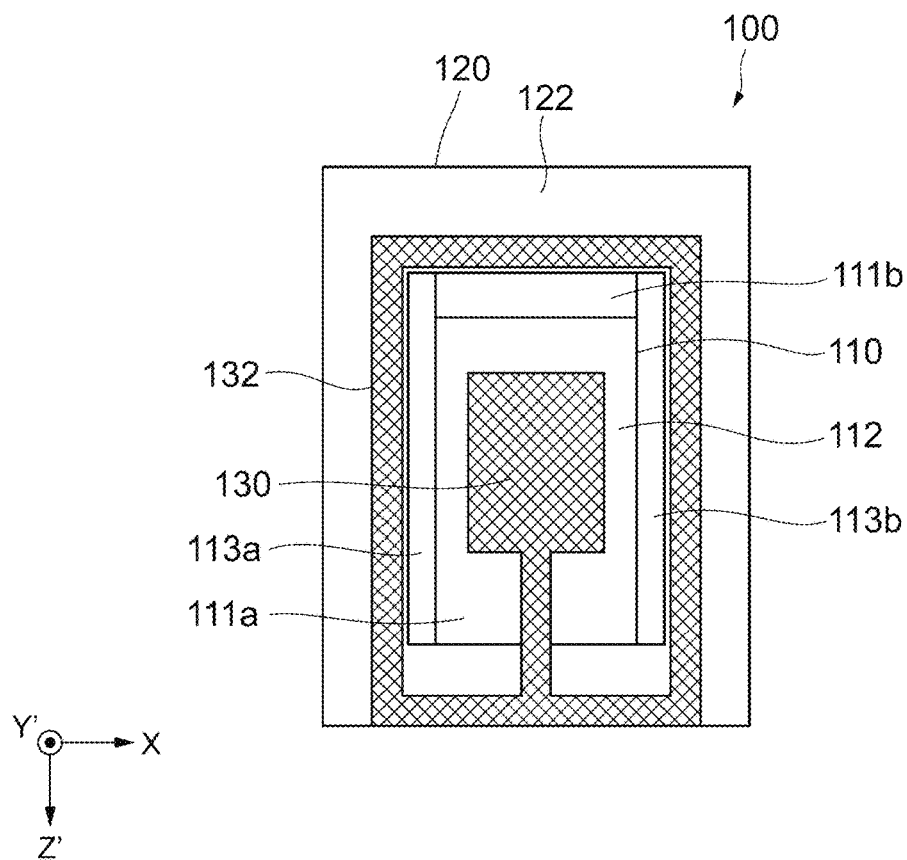
FIG. 2 is a plan view of a quartz crystal blank 110 according to the first exemplary embodiment of the present invention as seen from a main surface 112 side.
Figure 3:
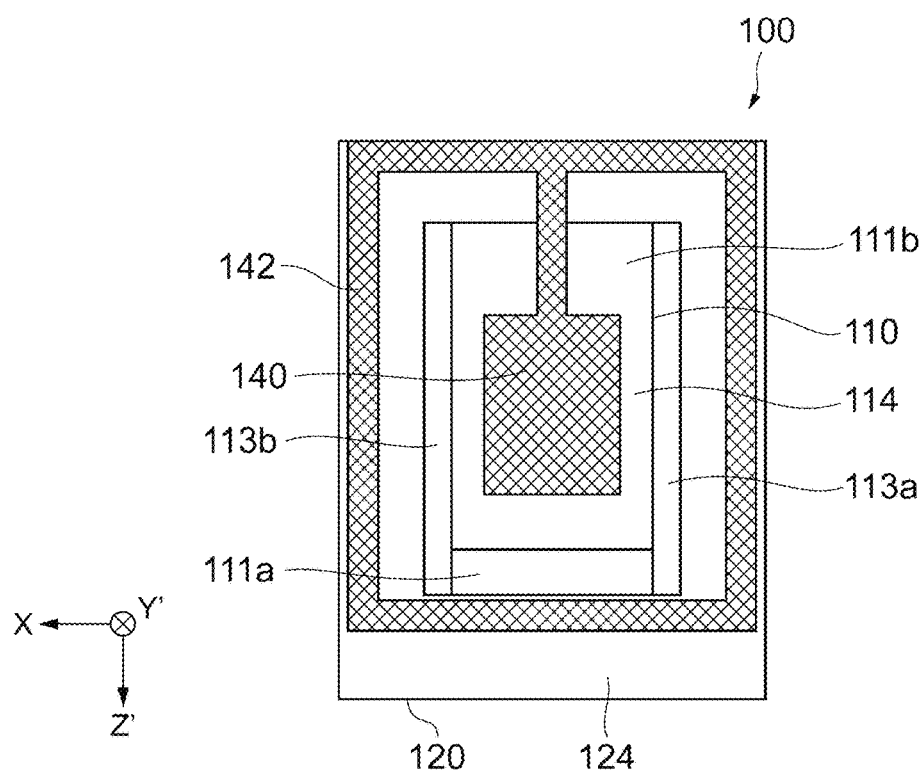
FIG. 3 is a plan view of the quartz crystal blank 110 according to a first exemplary embodiment of the present invention as seen from a main surface 114 side.
Figure 4:
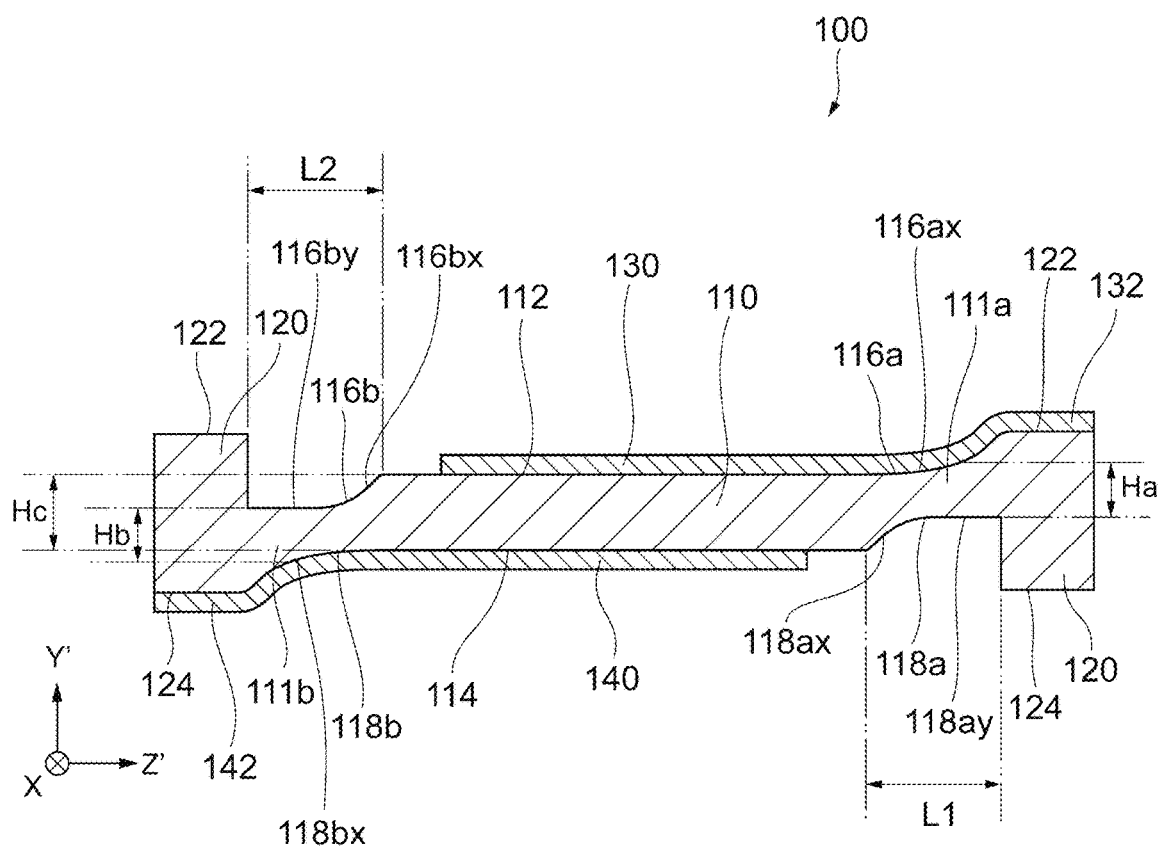
FIG. 4 is a sectional view taken along line IV-IV in FIG. 1.
Figure 5:
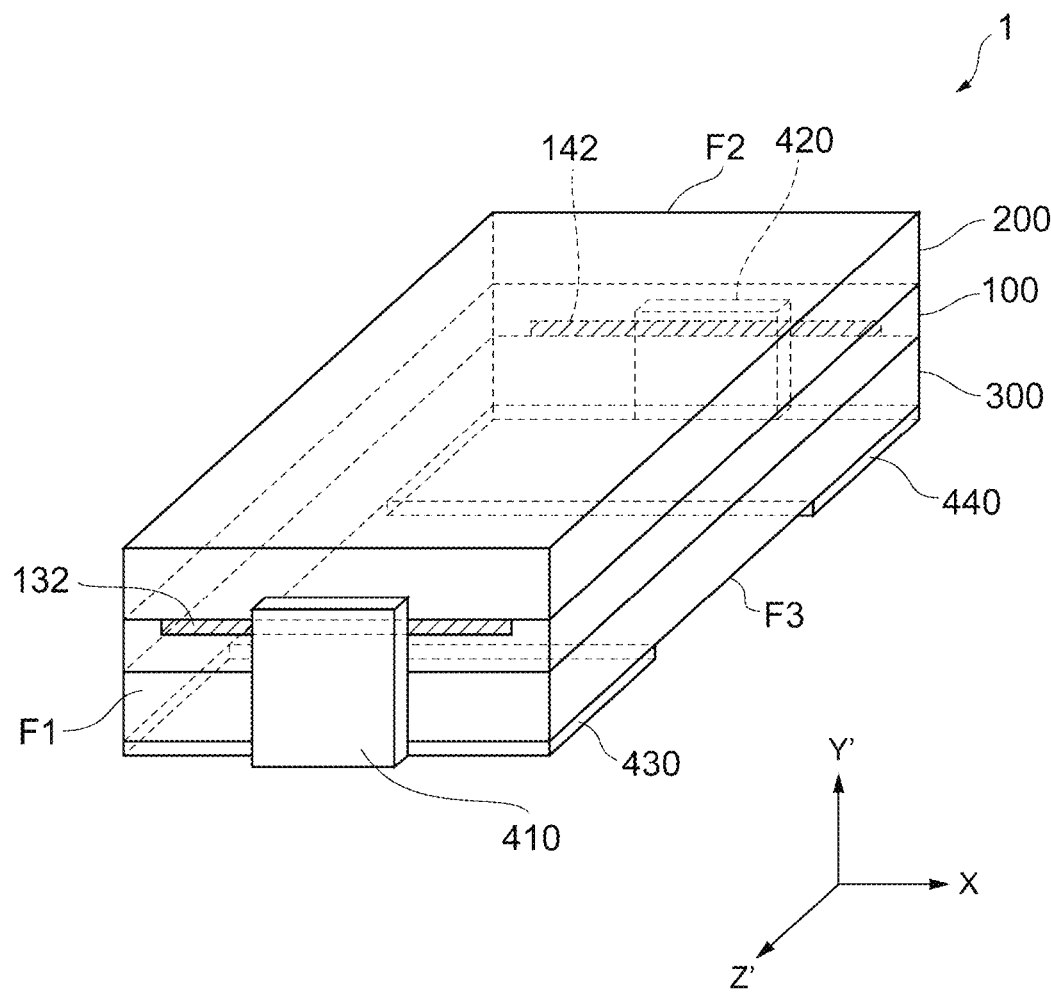
FIG. 5 is a perspective view of the quartz crystal resonator unit 1 according to the first exemplary embodiment of the present invention.

Referring to FIGS. 1 to 5, a quartz crystal resonator unit according to a first exemplary embodiment of the present invention will be described. FIG. 1 is an exploded perspective view of a quartz crystal resonator unit 1 according to the first embodiment. FIG. 2 is a plan view of a quartz crystal blank 110 according to the first embodiment as seen from a main surface 112 side. FIG. 3 is a plan view of the quartz crystal blank 110 according to a first embodiment as seen from a main surface 114 side. FIG. 4 is a sectional view taken along line IV-IV in FIG. 1. FIG. 5 is a perspective view of the quartz crystal resonator unit 1 according to the first embodiment.

As illustrated in FIG. 1, the quartz crystal resonator unit 1 according to the present embodiment includes a quartz crystal resonator 100, a lid member 200 (also referred to as a "lid"), and a base member 300 (also referred to as a "base"). It is noted that with referent to FIG. 1, outer electrodes described below are omitted.

According to the exemplary aspect, the quartz crystal resonator 100, the lid member 200, and the base member 300 are each made from an AT-cut quartz crystal substrate. The AT-cut quartz crystal substrate is cut out so that, when an X-axis, a Y-axis, and a Z-axis are the crystal axes of a quartz crystal and a Y'-axis and a Z'-axis are respectively axes that are obtained by rotating the Y-axis and the Z-axis around the X-axis by 35 degrees 15 minutes±1 minute 30 seconds in a direction from the Y-axis toward the Z-axis, the quartz crystal substrate has main surfaces that are parallel to a surface defined by the X-axis and the Z'-axis. The X-axis, the Z'-axis, and the Y'-axis intersect each other, and according to the present embodiment, perpendicularly intersect each other. In the present embodiment, a quartz crystal substrate that is AT-cut from a synthetic quartz crystal is used in the quartz crystal resonator. A quartz crystal resonator using an AT-cut quartz crystal substrate is generally used with a thickness shear vibration mode as a main vibration. Hereinafter, elements of the quartz crystal resonator unit will be described with reference to the axial direction of the AT-cut quartz crystal.

The quartz crystal resonator 100 includes the quartz crystal blank 110, a frame body 120 (also referred to as a "frame") that surrounds the outer periphery of the quartz crystal blank 110, and coupling members 111a and 111b that couple the quartz crystal blank 110 to the frame body 120. The quartz crystal blank 110, the frame body 120, and the coupling members 111a and 111b are each made from an AT-cut quartz crystal substrate. Hereinafter, referring to FIGS. 2 to 4, elements of the quartz crystal resonator 100 will be described in detail.

The quartz crystal blank 110 is a body portion of the quartz crystal resonator 100 and has a flat plate-like shape having two main surfaces facing each other. To be specific, the quartz crystal blank 110 has the main surface 112 (i.e., a first main surface) on the positive Y'-axis side and the main surface 114 (i.e., a second main surface) on the negative Y'-axis side. As described below, the quartz crystal blank 110 and the coupling members 111a and 111b are continuously formed. However, in the present embodiment, for convenience of description, main surfaces of a region corresponding to the quartz crystal blank 110, that is, a region of the quartz crystal resonator 100 excluding the coupling members 111a and 111b and the frame body 120 will be referred to as the main surfaces 112 and 114. As described above, the quartz crystal blank 110 and the coupling members 111a and 111b may be continuously formed without being distinguished from each other.

In plan view as seen from the main surface 112 side and in plan view as seen from the main surface 114 side, the quartz crystal blank 110 has a pair of long sides (long sides of the main surfaces 112 and 114) that are parallel to the Z'-axis (e.g., a first direction) and a pair of short sides (short sides of the main surfaces 112 and 114) that are parallel to the X-axis (e.g., a second direction). Moreover, the quartz crystal blank 110 has a thickness in a direction parallel to the Y'-axis (e.g., a third direction) (hereinafter, the thickness in the direction parallel to the Y'-axis will be simply referred to as the "thickness"). In the exemplary embodiments herein, the long sides, the short sides, and sides in the thickness direction of the quartz crystal blank 110 are parallel to the corresponding axes. However, the present invention is not limited to this. As long as the sides of the quartz crystal blank 110 extend along the axes, the sides need not be strictly parallel to the axes. The same applies to a quartz crystal blank 610 described below. The quartz crystal blank 110 is separated from the frame body 120, and the quartz crystal blank 110 and the frame body 120 are coupled to each other by the two coupling members 111a and 111b. Moreover, the quartz crystal blank 110 is configured to vibrate at a predetermined frequency.

The frame body 120 is a frame portion of the quartz crystal resonator 100. In plan view as seen from the main surface 112 side of the quartz crystal blank 110 or in plan view as seen from the main surface 114 side, the frame body 120 surrounds the outer periphery of the quartz crystal blank 110 in the Z'X-plane. To be specific, at both end portions (also referred to as "ends") of the quartz crystal blank 110 in the Z'-axis direction, the frame body 120 is coupled to the quartz crystal blank 110 by the coupling members 111a and 111b; and, at both end portions of the quartz crystal blank 110 in the X-axis direction, the frame body 120 is separated from the both end portions with predetermined clearances. That is, as illustrated in FIGS. 2 and 3, a through portion 113a (i.e., a first through portion) and a through portion 113b (i.e., a second through portion) are interposed between both end portions of the quartz crystal blank 110 in the X-axis direction and the frame body 120. The through portions 113a and 113b each extend over a length that is the sum of the lengths of the quartz crystal blank 110 and the coupling members 111a and 111b in the Z'-axis direction. The frame body 120 has an upper surface 122 on the main surface 112 side of the quartz crystal blank 110, a lower surface 124 on the main surface 114 side of the quartz crystal blank 110, an inner side surface facing the quartz crystal blank 110, and an outer side surface on the outside. The frame body 120 is a frame portion that is joined to the lid member 200 and the base member 300 described below. The thickness of the frame body 120 is larger than the thickness of the quartz crystal blank 110, and a space in which the quartz crystal blank 110 can vibrate is formed when the lid member 200 and the base member 300 are joined to the quartz crystal resonator 100. In other words, the main surface 112 and the main surface 114 of the quartz crystal blank 110 are located between the upper surface 122 and the lower surface 124 of the frame body 120 in the Y'-axis direction.

The coupling member 111a (i.e., a first coupling portion) and the coupling member 111b (i.e., a second coupling) are coupling portions that couple the quartz crystal blank 110 and the frame body 120 to each other and are disposed at both ends of the quartz crystal blank 110 in the Z'-axis direction. The coupling member 111a extends in the positive Z'-axis direction (e.g., a first direction) from one of the pair of short sides of the quartz crystal blank 110 on the positive Z'-axis side (one end side) while keeping the length of the short side in the X-axis direction (hereinafter, referred to as the "width") and couples the quartz crystal blank 110 and the frame body 120 to each other. The coupling member 111b extends in the negative Z'-axis direction (e.g., the first direction) from the other of the pair of short sides of the quartz crystal blank 110 on the negative Z'-axis side (the other end side) while keeping the width of the short side and couples the quartz crystal blank 110 and the frame body 120 to each other. That is, the quartz crystal blank 110 and the coupling members 111a and 111b are continuously disposed in such a way that both side surfaces of the quartz crystal blank 110, which are located at both end portions in the X-axis direction and which extend in the Z'-axis direction, and both side surfaces of the coupling member 111a and the coupling member 111b, which are located at both end portions in the X-axis direction and which extend in the Z'-axis direction, have common surfaces that continuously extend in the Z'-axis direction. Thus, the lengths of the coupling members 111a and 111b in the X-axis direction are, for example, substantially the same as the lengths of the short sides of the quartz crystal blank 110. Before describing the details of the shapes of the coupling members 111a and 111b, electrodes formed in the quartz crystal resonator 100 will be described.

As illustrated in FIGS. 2 and 3, an excitation electrode 130 (referred to as a first excitation electrode) is formed on the main surface 112 of the quartz crystal blank 110, and an excitation electrode 140 (referred to as a second excitation electrode) is formed on the main surface 114. The excitation electrode 130 and the excitation electrode 140 face each other with the quartz crystal blank 110 therebetween and substantially overlap each other (in the thickness direction) with the quartz crystal blank 110 therebetween.

An extension electrode 132 (referred to as a first extension electrode), which is electrically connected the excitation electrode 130, is formed on the upper surface 122 of the frame body 120. An extension electrode 142 (referred to as a second extension electrode), which is electrically connected the excitation electrode 140, is formed on the lower surface 124 of the frame body 120. As illustrated in FIG. 2, the extension electrode 132 extends from the excitation electrode 130 via the coupling member 111a to the upper surface 122 of the frame body 120 and extends to reach an outer side surface on the positive Z'-axis side. As illustrated in FIG. 3, the extension electrode 142 extends from the excitation electrode 140 via the coupling member 111b to the lower surface 124 of the frame body 120 and extends to reach an outer side surface on the negative Z'-axis side. Thus, on both end surfaces of the quartz crystal resonator 100 in the Z'-axis direction, it is possible to form outer electrodes that are electrically connected to a corresponding one of the excitation electrodes 130 and 140 via the extension electrodes 132 and 142. The directions in which the extension electrodes 132 and 142 extend are not limited to both end portions in the Z'-axis direction. For example, the directions in which the extension electrodes 132 and 142 extend may be both end portions in the X-axis direction. In accordance with positions where outer electrodes are to be formed, the directions in which the extension electrodes 132 and 142 extend may be changed as appropriate.

In the present embodiment, the extension electrode 132 extends along the entire periphery of the upper surface 122 of the frame body 120 as illustrated in FIG. 2, and the extension electrode 142 extends along the entire periphery of the lower surface 124 of the frame body 120 as illustrated in FIG. 3. Moreover, in plan view as seen from the positive Y'-axis direction, the extension electrodes 132 and 142 are disposed in such a way that at least parts thereof do not overlap each other in the thickness direction. To be specific, in the example illustrated in FIGS. 2 and 3, excluding a region on the positive Z'-axis side, the extension electrode 132 is disposed near the inner periphery of the frame body 120, and the extension electrode 142 is disposed near the outer periphery of the frame body 120. Thus, the distance between the extension electrode 132 and the extension electrode 142 via the frame body 120 is long, and parasitic capacity that may be generated between the extension electrodes is reduced. Accordingly, the effect of noise from one of the extension electrodes on the other extension electrode is reduced.

Because the extension electrodes 132 and 142 extend to end surfaces of the quartz crystal resonator 100 as described above, it is possible to electrically connect the excitation electrodes 130 and 140 to the outside of the quartz crystal resonator unit 1 via the end surfaces of the quartz crystal resonator 100.

Next, referring to FIG. 4, the shapes of the coupling members 111a and 111b will be described in detail. As illustrated in FIG. 4, the coupling members 111a and 111b respectively have portions whose thicknesses Ha and Hb in the Y'-axis direction are smaller than the thickness Hc of a region of the quartz crystal blank 110 where the excitation electrode 130 and the excitation electrode 140 face each other.

More particularly, the coupling member 111a has an upper surface 116a on the main surface 112 side of the quartz crystal blank 110 (hereinafter, the positive Y'-axis side (one side) may be referred to as the "upward direction") and a lower surface 118a on the main surface 114 side of the quartz crystal blank 110 (hereinafter, the negative Y'-axis side (the other side) may be referred to as the "downward direction"). The upper surface 116a of the coupling member 111a has an inclined portion that is inclined in the upward direction with respect to the main surface 112 from the quartz crystal blank 110 toward the frame body 120. The lower surface 118a of the coupling member 111a has an inclined portion that is inclined in the upward direction with respect to the main surface 114 from the quartz crystal blank 110 toward the frame body 120. Because the lower surface 118a is inclined in the upward direction (positive Y'-axis direction) in this way, a portion of the coupling member 111a whose thickness Ha is smaller than the thickness Hc of the quartz crystal blank 110 is formed.

As further shown, the coupling member 111b has an upper surface 116b in the upward direction and a lower surface 118b in the downward direction. The upper surface 116b of the coupling member 111b has an inclined portion that is inclined in the downward direction with respect to the main surface 112 from the quartz crystal blank 110 toward the frame body 120. The lower surface 118b of the coupling member 111b has an inclined portion that is inclined in the downward direction with respect to the main surface 114 from the quartz crystal blank 110 toward the frame body 120. Because the upper surface 116b is inclined in the downward direction (i.e., the negative Y'-axis direction) in this way, a portion of the coupling member 111b whose thickness Hb is smaller than the thickness Hc of the quartz crystal blank 110 is formed.

To be more specific, the upper surface 116a of the coupling member 111a has a shape such that, from the main surface 112 of the quartz crystal blank 110 to the upper surface 122 of the frame body 120, an inclined portion 116ax, which is connected to the main surface 112 and has a recessed shape that opens in the upward direction, connects the main surface 112 and the upper surface 122 of the frame body 120 to each other. The lower surface 118a of the coupling member 111a has a shape such that, from the main surface 114 of the quartz crystal blank 110 to the inner side surface of the frame body 120, an inclined portion 118ax, which has a recessed shape that opens in the downward direction, and a flat surface portion 118ay, which has a planar shape parallel to the main surface 114 of the quartz crystal blank 110, connect the main surface 114 and the inner side surface of the frame body 120 to each other. The upper surface 116b of the coupling member 111b has a shape such that, from the main surface 112 of the quartz crystal blank 110 to the inner side surface of the frame body 120, an inclined portion 116bx, which has a recessed shape that opens in the upward direction, and a flat surface portion 116by, which has a planar shape parallel to the main surface 112 of the quartz crystal blank 110, connect the main surface 112 and the inner side surface of the frame body 120 to each other. The lower surface 118b of the coupling member 111b has a shape such that, from the main surface 114 of the quartz crystal blank 110 to the lower surface 124 of the frame body 120, an inclined portion 118bx, which is connected to the main surface 114 and has a recessed shape that is open in the downward direction, connects the main surface 114 and the lower surface 124 of the frame body 120 to each other. In other words, the inclined portion 116ax and the inclined portion 116bx each have a curved shape that is recessed downward, and the inclined portion 118ax and the inclined portion 118bx each have a curved shape that is recessed upward. Thus, the coupling members 111a and 111b each have a shape such that, from the inside toward the outside of the quartz crystal resonator 100, the thickness thereof monotonously decreases and then monotonously increases. The upper surface 116a of the coupling member 111a and the upper surface 122 of the frame body 120 may be connected to each other in such a way that the boundary therebetween is shaped like a curved surface. Such a boundary shape also applies to the boundary between the lower surface 118a of the coupling member 111a and the main surface 114 of the quartz crystal blank 110, the boundary between the upper surface 116b of the coupling member 111b and the main surface 112 of the quartz crystal blank 110, and the boundary between the lower surface 118b of the coupling member 111b and the lower surface 124 of the frame body 120. It is noted the that exemplary embodiment can be modified in which any or all of the upper surfaces 116a and 116b and the lower surfaces 118a and 118b are flat surfaces or a modification in which these surfaces are a combination flat surfaces and cured surfaces according to variations of the exemplary embodiment.

In the example illustrated in FIG. 4, the quartz crystal blank 110, the coupling members 111a and 111b, and the frame body 120 each have a shape that is point-symmetric about the center of the quartz crystal blank 110 (not shown) in the Y'Z'-plane. That is, the upper surface 116a and the lower surface 118b have the same shape, and the lower surface 118a and the upper surface 116b have the same shape.

With the structure described above, the thicknesses of the quartz crystal blank 110 and the coupling members 111a and 111b and the thicknesses of the coupling members 111a and 111b and the frame body 120 differ from each other at the boundaries therebetween. Thus, while the quartz crystal blank 110 is supported by the frame body 120 via the coupling members 111a and 111b, leakage of vibration of the quartz crystal blank 110 to the frame body 120 via the coupling members 111a and 111b is suppressed. Accordingly, the vibration can be confined in the quartz crystal blank 110.

The inclination angle of the upper surface 116a at a portion where the upper surface 116a is connected to a short side of the quartz crystal blank 110 on the positive Z'-axis side (i.e., one side in the first direction), that is, at a portion near the boundary between the main surface 112 of the quartz crystal blank 110 and the upper surface 116a of the coupling member 111a is smaller than the inclination angle of the lower surface 118a at a portion where the lower surface 118a is connected to a short side of the quartz crystal blank 110 on the positive Z'-axis side (i.e., one side in the first direction), that is, at a portion near the boundary between the main surface 114 of the quartz crystal blank 110 and the lower surface 118a of the coupling member 111a. In other words, the upper surface 116a is gently inclined in the upward direction toward the frame body 120 and is continuously connected to the upper surface 122 of the frame body 120. The lower surface 118a is curved in the upward direction from the boundary that extends in the X-axis direction toward the frame body 120 and is perpendicularly connected to the inner side surface of the frame body 120. Thus, change in angle from the main surface 112 of the quartz crystal blank 110 via the upper surface 116a of the coupling member 111a to the upper surface 122 of the frame body 120 is smaller than change in angle from the main surface 114 of the quartz crystal blank 110 via the lower surface 118a of the coupling member 111a and the inner side surface of the frame body 120 to the lower surface 124 of the frame body 120.

Likewise, the inclination angle of the lower surface 118b at a portion where the lower surface 118b is connected to a short side of the quartz crystal blank 110 on the negative Z'-axis side (i.e., the other side in the first direction), that is, a portion near the boundary between the main surface 114 of the quartz crystal blank 110 and the lower surface 118b of the coupling member 111b is smaller than the inclination angle of the upper surface 116b at a portion where the upper surface 116b is connected to a short side of the quartz crystal blank 110 on the negative Z'-axis direction (i.e., the other side in the first direction), that is, at a portion near the boundary between the main surface 112 of the quartz crystal blank 110 and the upper surface 116b of the coupling member 111b. In other words, the lower surface 118b is gently inclined in the downward direction toward the frame body 120 and is continuously connected to the lower surface 124 of the frame body 120. The upper surface 116b is curved in the downward direction from the boundary that extends in the X-axis direction toward the frame body 120 and is perpendicularly connected to the inner side surface of the frame body 120. Thus, change in angle from the main surface 114 of the quartz crystal blank 110 via the lower surface 118b of the coupling member 111b to the lower surface 124 of the frame body 120 is smaller than change in angle from the main surface 112 of the quartz crystal blank 110 via the upper surface 116b of the coupling member 111b and the inner side surface of the frame body 120 to the upper surface 122 of the frame body 120.

In such shapes of the coupling members 111a and 111b, the extension electrodes 132 and 142 described above respectively extend to outer side surfaces of the frame body 120 via surfaces (e.g., the upper surface 116a and the lower surface 118b) whose inclination angles with respect to the main surfaces 112 and 114 of the quartz crystal blank 110 are smaller. Thus, in contrast to a structure in which the extension electrodes extend via the lower surface 118a and the upper surface 116b, the extension electrodes are prevented from extending at right angles at the boundary between the coupling member and the frame body and at the boundary between the inner side surface of the frame body and the upper surface or the lower surface of the frame body. Accordingly, the probability of breakage of the extension electrode, which may occur due to thermal contraction or stress concentration of the extension electrode, can be reduced due to this configuration.

Next, referring back to FIG. 1, the lid member 200 and the base member 300 will be described. The lid member 200 and the base member 300 are each an example of a package member and are joined to the quartz crystal resonator 100 so as to contain a part of the quartz crystal resonator 100 (at least including the quartz crystal blank 110). The quartz crystal resonator 100, the lid member 200, and the base member 300 each have the substantially the same planar shape, such as a rectangular shape, in plan view as seen in the thickness direction of each member.

The lid member 200 is disposed on the main surface 112 side of the quartz crystal blank 110, and the base member 300 is disposed on the main surface 114 side of the quartz crystal blank 110. The lid member 200, the quartz crystal resonator 100, and the base member 300 are stacked in this order to form a three-layer structure.

As illustrated in FIG. 1, the lid member 200 and the base member 300 each have a flat plate-like shape. The lid member 200 is joined to the entire periphery of the upper surface 122 of the frame body 120 of the quartz crystal resonator 100, and the base member 300 is joined to the entire periphery of the lower surface 124 of the frame body 120 of the quartz crystal resonator 100. Thus, the quartz crystal blank 110 and the coupling members 111a and 111b are sealed in a cavity, which is a hermetically sealed inner space defined between the lid member 200 and the base member 300.

It is noted that the material of each of the lid member 200 and the base member 300 is not particularly limited. However, in the present embodiment, the material is an AT-cut synthetic quartz crystal that is the same material as the quartz crystal resonator 100 and that is cut in the same way as the material of the quartz crystal resonator 100. Thus, because members that are to be joined are made of the same material, it is possible to directly join the lid member 200 to the upper surface 122 of the frame body 120 and to directly join the base member 300 to the lower surface 124 of the frame body 120 without using a joining member, such as an adhesive, a brazing alloy, or a glass joining material. It is not intended that use of a joining member is excluded, and the lid member 200, the frame body 120, and the base member 300 may be joined via a joining member. As the material of each of the lid member 200 and the base member 300, a material other than a quartz crystal may be used. For example, a glass material or a glass epoxy resin, in which glass fibers are impregnated with an epoxy resin, may be used in alternative aspects. Moreover, it is noted that the shape of each of the lid member 200 and the base member 300 is not limited to a flat plate-like shape.

Next, referring to FIG. 5, outer electrodes will be described. As illustrated in FIG. 5, in the quartz crystal resonator unit 1 according to the present embodiment, outer electrodes 410, 420, 430, and 440 are formed on end surfaces (i.e., end surfaces of the quartz crystal resonator 100, the lid member 200, and the base member 300) and a bottom surface (i.e., a surface of the base member 300 on a side opposite to the quartz crystal resonator 100).

The outer electrodes 410, 420, 430, and 440 are each electrically connected a corresponding one of the excitation electrode 130 and the excitation electrode 140 to provide the quartz crystal resonator unit 1 with electrical connection to the outside and mountability. As shown, the outer electrode 410 is formed on a surface F1, which is an end surface of the quartz crystal resonator unit 1 to which the extension electrode 132 extends. The outer electrode 420 is formed on a surface F2, which is an end surface of the quartz crystal resonator unit 1 to which the extension electrode 142 extends. The outer electrode 430 is electrically connected to the outer electrode 410 and is formed on a bottom surface F3 of the quartz crystal resonator unit 1 (i.e., a surface on the negative Y'-axis side). The outer electrode 440 is electrically connected to the outer electrode 420 and is formed on the bottom surface F3 of the quartz crystal resonator unit 1. Thus, the quartz crystal resonator unit 1 has the outer electrodes 410 and 430, which are electrically connected to the excitation electrode 130, and outer electrodes 420 and 440, which are electrically connected to the excitation electrode 140. With this structure, by applying an alternating-current voltage between the excitation electrode 130 and the excitation electrode 140 of the quartz crystal resonator 100 via the outer electrodes 410 and 430 and the outer electrodes 420 and 440, the quartz crystal blank 110 can be configured to vibrate in a predetermined vibration mode, such as thickness shear vibration mode, thereby obtaining resonance characteristics due to the vibration.

With the structure described above, the quartz crystal resonator unit 1 need not have through portions at both end portions of the quartz crystal blank 110 in the Z'-axis direction in contrast to, for example, a structure described in Patent Document 1 (hereinafter, referred to as the "conventional structure"). Therefore, it is possible to provide an appropriate area to the quartz crystal blank 110. The through portions 113a and 113b are formed at both end portions of the quartz crystal blank 110 in the X-axis direction, and the coupling members 111a and 111b each have a portion whose thickness is smaller than the thickness of the quartz crystal blank 110. Thus, leakage of vibration is suppressed, and the vibration can be confined in the quartz crystal blank 110. Accordingly, the size of the quartz crystal resonator unit 1 can also be reduced while suppressing deterioration of vibration characteristics.

As further shown, the coupling members 111a and 111b are joined from the quartz crystal blank 110 to the frame body 120 with widths that are substantially the same as those of the short sides of the quartz crystal blank 110, and therefore the strengths of the coupling members against impact from the outside can be improved, compared with the conventional structure.

With the quartz crystal resonator unit 1, without forming via electrodes, the excitation electrode 130 and the excitation electrode 140 can be electrically connected to outer electrodes by using the extension electrodes 132 and 142.

Accordingly, the connection reliability of a product is improved, compared with a structure including via electrodes.

Moreover, with the quartz crystal resonator unit 1, the extension electrodes 132 and 142 extend to outer side surfaces of the frame body 120 via surfaces that are gently inclined and that are connected to the frame body 120. Accordingly, the probability of breakage of the extension electrodes is reduced, compared with a structure in which the extension electrodes extend at right angles.

In the present embodiment, the extension electrodes 132 and 142 are respectively formed so as to surround the entire peripheries of the upper surface 122 and the lower surface 124 of the frame body 120. However, arrangement of the extension electrodes is not particularly limited. That is, as long as the extension electrodes 132 and 142 extend to one of the outer side surfaces of the frame body 120, the extension electrodes 132 and 142 need not surround the entire peripheries of the upper surface 122 or the lower surface 124 of the frame body 120.

The thickness of the frame body 120 need not be larger than the thickness of the quartz crystal blank 110 and may be, for example, the same as the thickness of the quartz crystal blank. In this case, a space in which the quartz crystal blank can vibrate may be formed by forming recesses that are recessed in the Y'-axis direction in surfaces of the lid member and the base member that are joined to the quartz crystal resonator.

In the present embodiment, both of the coupling members 111a and 111b have portions whose thicknesses are smaller than the thickness of the quartz crystal blank 110 as described above. However, at least one of the two coupling members may have a portion whose thickness is smaller than the thickness of the quartz crystal blank 110. The boundary between the quartz crystal blank 110 and the coupling members 111a and 111b and the boundary between the coupling members 111a and 111b and the frame body 120 may be continuously formed, or a step may be formed in the Y'-axis direction.

Figure 6:
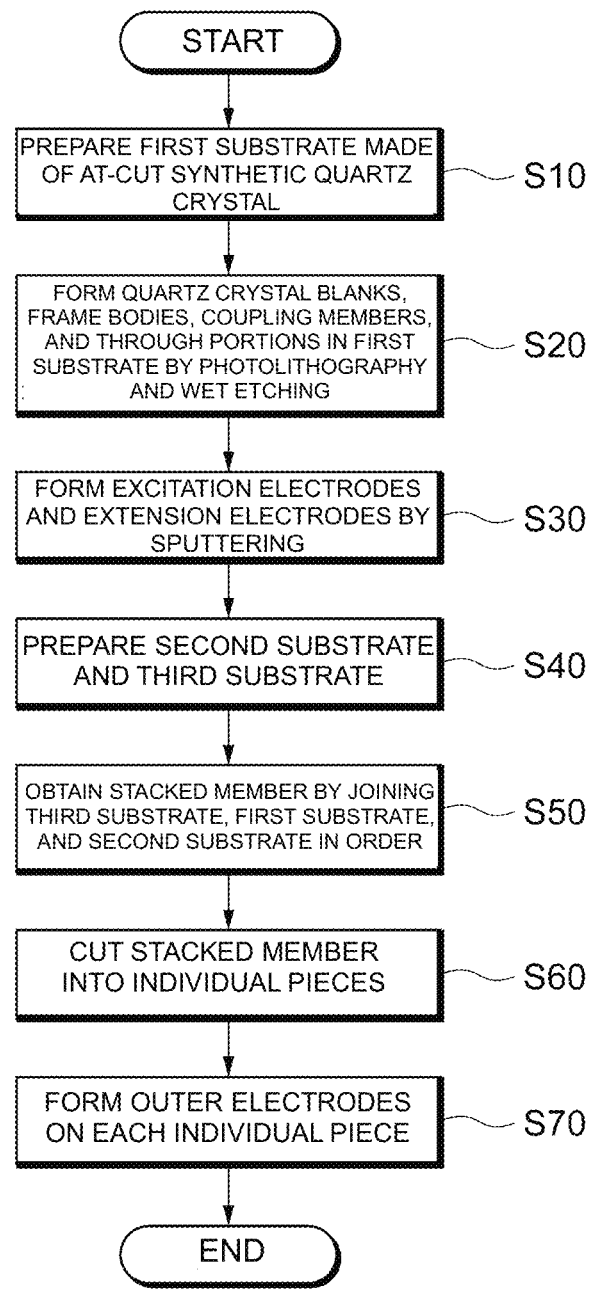
FIG. 6 is a flowchart illustrating a method of manufacturing the quartz crystal resonator unit 1 according to the first exemplary embodiment of the present invention.
Figure 7:
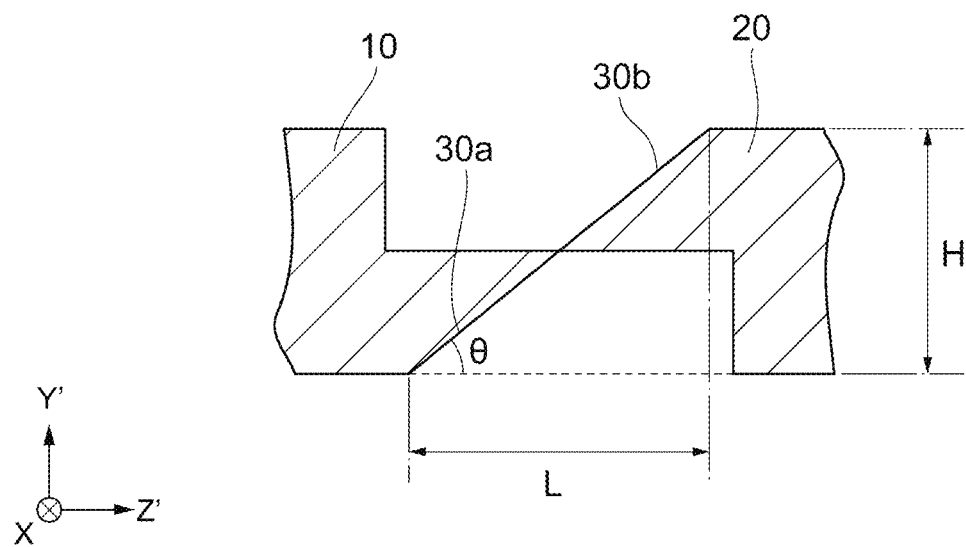
FIG. 7 is a sectional view illustrating how dissolution occurs when a portion between a quartz crystal blank and a frame body is etched.

Next, referring to the flowchart in FIG. 6 and referring to FIG. 7, a method of manufacturing the quartz crystal resonator unit 1 according to the first embodiment will be described. FIG. 6 is a flowchart illustrating the method of manufacturing the quartz crystal resonator unit 1 according to the first exemplary embodiment of the present invention. FIG. 7 is a sectional view illustrating how dissolution occurs when a portion between a quartz crystal blank and a frame body is etched. In the present description, a method of manufacturing a quartz crystal resonator unit by using a wafer-level packaging technology, which performs packaging in a wafer state, will be described as an example. Hereinafter, for convenience of description, elements that do not change before and after a wafer is divided into individual pieces of the quartz crystal resonator units 1 will be denoted by the same terms and numerals.

First, a first substrate is prepared (S10). The first substrate is a substrate for forming a plurality of quartz crystal resonators 100. In the present embodiment, the first substrate is, for example, a quartz crystal substrate made of an AT-cut synthetic quartz crystal.

Next, the quartz crystal blanks 110, the frame bodies 120, the coupling members 111a and 111b, and the through portions 113a and 113b are formed in the first substrate by photolithography and wet etching (S20). In the present embodiment, a plurality of quartz crystal resonators 100 are arranged in such a way that the long sides of the main surfaces 112 and 114 of the quartz crystal blanks 110 are parallel to the Z'-axis, the short sides are parallel to the X-axis, and the thicknesses of the quartz crystal blanks 110 are parallel to the Y'-axis. To be specific, by forming a mask on the first substrate and by dissolving the first substrate by wet etching, the quartz crystal blanks 110, the frame bodies 120, the coupling members 111a and 111b, and the through portions 113a and 113b are formed.

Because a quartz crystal substrate has crystal anisotropy, the dissolution rate differs in accordance with crystal orientation. To be specific, when a quartz crystal substrate is to be processed in the normal line direction of a main surface of the quartz crystal substrate (that is, the thickness direction of the quartz crystal substrate), in a cross section parallel to the Y'X-plane, dissolution easily proceeds in the normal line direction; but, in a cross section parallel to the Y'Z'-plane, dissolution does not proceed in the normal line direction but proceeds with an inclination toward the Z'-axis direction. For example, as illustrated in FIG. 7, when a through portion is to be formed between a quartz crystal blank 10 and a frame body 20, if etching is started from both main surfaces in the Y'-axis direction, etching proceeds so as to form inclined surfaces 30a and 30b that have an angle θ with respect to the main surfaces of the quartz crystal substrate. For example, if the cut angle of AT cut is 35 degrees, the angle θ is about 35 degrees. The etching rate of the inclined surfaces 30a and 30b, which have the Y-axis of quartz crystal as a normal line, is low, compared with surfaces that have the Z'-axis and the X-axis as normal lines. Therefore, dissolution of the inclined surfaces 30a and 30b proceeds slowly in the Z'-axis direction.

That is, as illustrated in FIG. 7, the distance L between the quartz crystal blank 10 and the frame body 20 immediately before a through portion is formed between the quartz crystal blank 10 and the frame body 20 is represented as L=H/tan θ, where H is the thickness of the quartz crystal substrate when it is assumed that the thicknesses of the quartz crystal blank 10 and the frame body 20 are the same. In other words, a through portion is not formed unless the distance L between the quartz crystal blank 10 and the frame body 20 satisfies L>H/tan θ. Accordingly, in order to form a through portion along substantially the entire periphery of a portion between the quartz crystal blank and the frame body, the distance L between the quartz crystal blank and the frame body at both end portions of the quartz crystal blank in the Z'-axis direction satisfies L>H/tan θ. In this case, the distance between the quartz crystal blank and the frame body is large, compared with a structure in which the through portion is not formed. That is, there is a problem in that, if reduction in size of the quartz crystal resonator is prioritized, the area of the quartz crystal blank decreases; and, if providing an appropriate area to the quartz crystal blank is prioritized, the outer shape of the quartz crystal resonator becomes large.

In contrast, in the present embodiment, the through portions 113a and 113b are formed in a direction in which wet etching easily proceeds in the normal line direction; and, in the direction in which dissolution becomes inclined, only the thicknesses of the quartz crystal substrate are reduced without forming a through portion so that the coupling members 111a and 111b remain between the quartz crystal blank 110 and the frame body 120. That is, in the present embodiment, L1<Hc/tan θ and L2<Hc/tan θ are satisfied, where L1 and L2 are respectively the lengths of the coupling members 111a and 111b in the Z'-axis direction (see FIG. 4), and Hc is the thickness of the quartz crystal blank 110. Thus, the size of the quartz crystal resonator 100 can be reduced while providing an appropriate area to the quartz crystal blank.

Referring back to FIG. 6, the excitation electrodes 130 and 140 and the extension electrodes 132 and 142 are formed by depositing films of an electroconductive material by sputtering (S30). Positions where the extension electrodes 132 and 142 are to be formed will not be described here, because the positions are the same as those of the quartz crystal resonator 100 described above.

Next, a second substrate and a third substrate are prepared (S40). The second substrate is a substrate for forming a plurality of lid members 200, and a third substrate is a substrate for forming a plurality of base members 300. The second substrate and the third substrate are each, for example, a quartz crystal substrate made of an AT-cut synthetic quartz crystal.

Next, a stacked member is obtained by joining the second substrate to an upper surface of the first substrate (i.e., a side on which the excitation electrodes 130 are formed on the quartz crystal blanks 110) and joining a third substrate to a lower surface of the first substrate (i.e., a side on which the excitation electrodes 140 are formed on the quartz crystal blanks 110) (S50). That is, the third substrate, the first substrate, and the second substrate are stacked in order in the Y'-axis direction and are joined to each other. At this time, the second substrate and the third substrate are joined to the entire peripheries of the upper surfaces or the lower surfaces of the frame bodies 120 of the first substrate. Thus, the plurality of quartz crystal blanks 110 in the first substrate are sealed by joining the second substrate and the third substrate. When all of the first substrate, the second substrate, and the third substrate are quartz crystal substrates, joining force due to intermolecular force is large, and sealability is improved.

Next, a plurality of individual pieces are obtained by cutting the stacked member (S60). The stacked member is cut in the Y'-axis direction into individual pieces of quartz crystal resonator units by dicing or wire-cutting.

Subsequently, outer electrodes are formed on each individual piece (S70). The outer electrodes are formed on the end surfaces and the bottom surface of the quartz crystal resonator unit by using, for example, an appropriate combination of sputtering, vacuum deposition, and plating. By forming the outer electrodes, the quartz crystal resonator unit is provided with mountability.

With this manufacturing method, the quartz crystal resonator unit 1 can be manufactured with reduced size while suppressing deterioration of vibration characteristics as described above. By arranging the quartz crystal resonators 100 in the first substrate in such a way that the long sides of the main surfaces 112 and 114 of the quartz crystal blanks 110 are parallel to the Z'-axis and the short sides are parallel to the X-axis, the through portions 113a and 113b and the inclined portions of the coupling members 111a and 111b can be formed by using the anisotropy of etching. Accordingly, with a simple manufacturing process, it is possible to form the quartz crystal resonator 100 that can be reduced in size while confining vibration in the quartz crystal blank 110.

By using dry etching instead of wet etching, it is possible to perform etching in the normal line direction of the main surface of the quartz crystal substrate. However, etching rate of dry etching is lower than that of wet etching. As such, it is necessary to perform etching by arranging wafers one by one in a plane. That is, by using wet etching, it is possible to process a quartz crystal substrate in a shorter time than by using dry etching and to achieve high mass-productivity. It is noted that the exemplary embodiment is not intended to the use of wet etching and that the use of dry etching is not be excluded.

Figure 8:
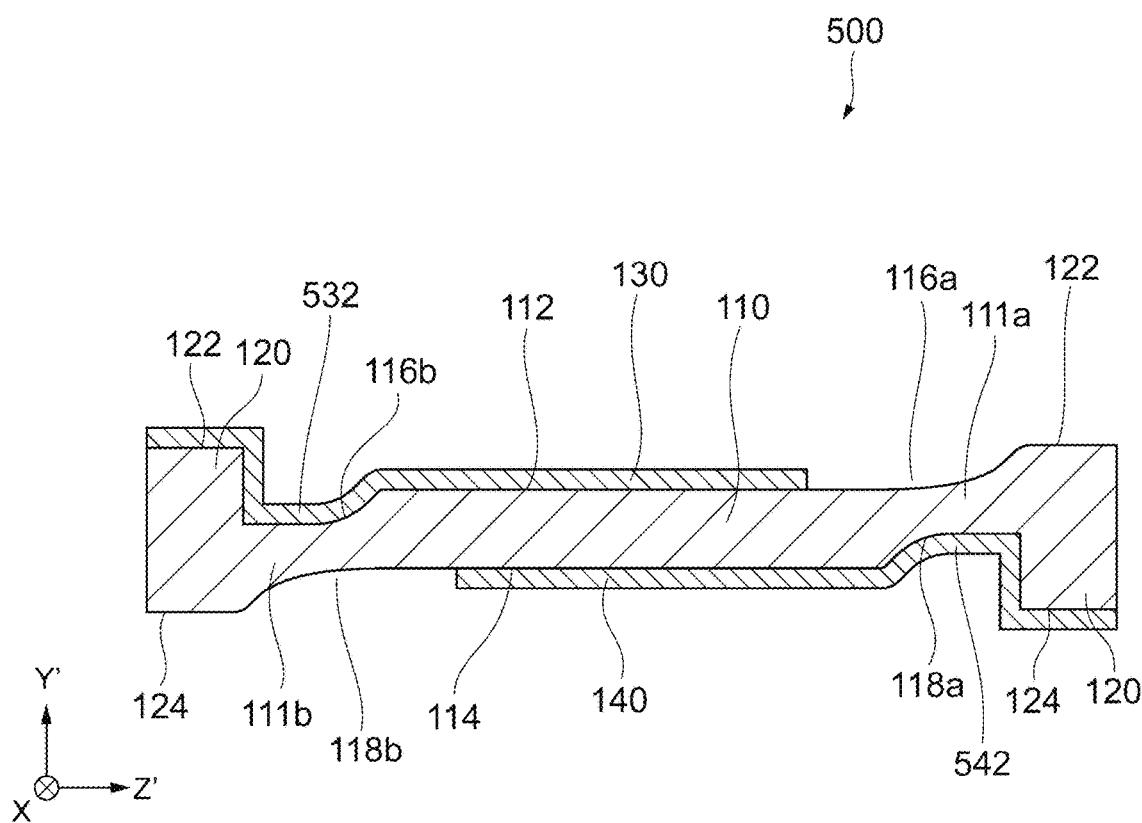
FIG. 8 is a sectional view of a quartz crystal resonator 500 according to a second exemplary embodiment of the present invention in which, specifically, an extension electrode is different in a sectional view similar to FIG. 4.

Next, referring to FIG. 8, a quartz crystal resonator according to a second exemplary embodiment of the present invention will be described. FIG. 8 is a sectional view of a quartz crystal resonator 500 according to the second embodiment of the present invention, in which, specifically, an extension electrode is different in a sectional view similar to FIG. 4. In the following description, differences from the first embodiment will be described.

As illustrated in FIG. 8, the quartz crystal resonator 500 according to the present embodiment differs from the quartz crystal resonator 100 shown in FIG. 4 in the directions in which extension electrodes extend. To be specific, an extension electrode 532, which is electrically connected to the excitation electrode 130, extends via the upper surface 116b of the coupling member 111b to reach an outer side surface of the frame body 120 on the negative Z'-axis side. An extension electrode 542, which is electrically connected to the excitation electrode 140, extends via the lower surface 118a of the coupling member 111a to reach an outer side surface of the frame body 120 on the positive Z'-axis side. As described above, the directions in which extension electrodes extend are not limited to the directions in which the extension electrodes 132 and 142 shown in FIG. 4 extend.

Also with this structure, the quartz crystal resonator 500 can obtain the same advantages as the quartz crystal resonator 100 as described above.

Figure 9:
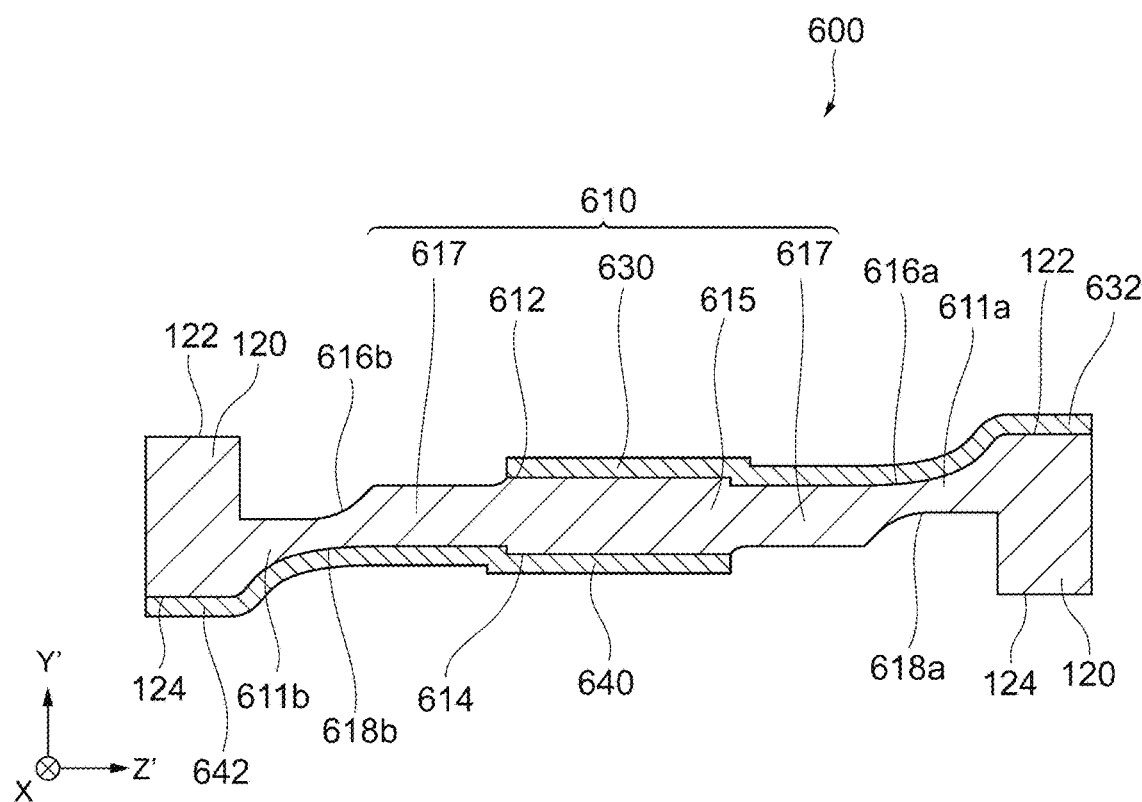
FIG. 9 is a sectional view of a quartz crystal resonator 600 according to a third exemplary embodiment of the present invention in which, specifically, a quartz crystal blank is different in a sectional view similar to FIG. 4.

Next, referring to FIG. 9, a quartz crystal resonator according to a third exemplary embodiment of the present invention will be described. FIG. 9 is a sectional view of a quartz crystal resonator 600 according to the third embodiment of the present invention, in which, specifically, a quartz crystal blank is different in a sectional view similar to FIG. 4.

In the quartz crystal resonator 100 shown in FIG. 4, the quartz crystal blank 110 has a flat plate-like shape. In the quartz crystal resonator 600 shown in FIG. 9, a quartz crystal blank 610 has a mesa shape. To be specific, the quartz crystal blank 610 includes a middle portion 615 including the center in the X-axis direction and the Z'-axis direction, and a peripheral portion 617 that is located around the middle portion 615 in plan view of the XZ'-plane and that has a thickness smaller than that of the middle portion 615. The middle portion 615 of the quartz crystal blank 610 has a main surface 612 (first main surface) on the positive Y'-axis side and a main surface 614 (second main surface) on the negative Y'-axis side. The entirety of the quartz crystal blank 610 has a pair of long sides parallel to the Z'-axis and a pair of short sides parallel to the X-axis in plan view as seen from the main surface 612 side or the main surface 614 side.

As with the coupling members 111a and 111b shown in FIG. 4, the coupling members 611a and 611b extend in the Z'-axis direction from the pair of short sides at both end portions of the quartz crystal blank 610 in the Z'-axis direction, that is, from the boundaries between the peripheral portion 617 of the quartz crystal blank 610 and the coupling members 611a and 611b while keeping the widths of the short sides, and couple the quartz crystal blank 610 and the frame body 120 to each other. An excitation electrode 630 is formed on the main surface 612 of the middle portion 615, and an excitation electrode 640 is formed on the main surface 614 of the middle portion 615. Moreover, an extension electrode 632, which is electrically connected to the excitation electrode 630, and an extension electrode 642, which is electrically connected to the excitation electrode 640, are formed. The structures of an upper surface 616a and a lower surface 618a of the coupling member 611a, an upper surface 616b and a lower surface 618b of the coupling member 611b, the excitation electrodes 630 and 640, and the extension electrodes 632 and 642 are respectively the same as those of the upper surface 116a and the lower surface 118a of the coupling member 111a shown in FIG. 4, the upper surface 116b and the lower surface 118b of the coupling member 111b, the excitation electrodes 130 and 140, and the extension electrodes 132 and 142. Therefore, detailed description of these elements will be omitted. Moreover, as described above, the shape of the quartz crystal blank is not limited to a flat plate-like shape having a uniform thickness and may have a region having a different thickness.

With the structure described above, in the quartz crystal resonator 600, the coupling members 611a and 611b have portions whose thicknesses are smaller than the thickness of the peripheral portion 617 of the quartz crystal blank 610, and advantages the same as those of the quartz crystal resonator 100 can be obtained as described above. In the quartz crystal resonator 600, because the quartz crystal blank 610 has a mesa shape, the strength of confinement of vibration is increased compared with the quartz crystal resonator 100, and vibration characteristics are improved.

The peripheral portion 617 may be located around the entire periphery so as to surround the four sides of the middle portion 615 in plan view of the main surface 612. Alternatively, the peripheral portion 617 may be located at both end portions of the quartz crystal blank 610 in the Z'-axis direction, and, at both end portions of the quartz crystal blank 610 in the X-axis direction, the middle portion 615 may extend to reach the both ends.

In general, the exemplary quartz crystal resonator units described above may be used, for example, as a timing device or a load sensor. When the quartz crystal resonator unit is used as a load sensor for measuring a load in the long-side direction (i.e., the Z'-axis direction), in the long-side direction related to measurement, the quartz crystal blank is coupled to the frame body 120 via the coupling members; and, in the short-side direction (i.e., the X-axis direction) that is not related to measurement, the through portions are formed between the quartz crystal blank and the frame body. Accordingly, while maintaining sensitivity in load measurement, the effects due to external factors can be reduced, such as a stress in the short-side direction transmitted to the quartz crystal blank.

Heretofore, exemplary embodiments of the present invention have been described. The quartz crystal resonator 100 (500, 600) includes the quartz crystal blank 110, the excitation electrodes 130 and 140, the frame body 120 that surrounds the quartz crystal blank 110, and the coupling members 111a and 111b that couple the quartz crystal blank 110 and the frame body 120 to each other. The coupling members 111a and 111b extend from the quartz crystal blank 110 to the frame body 120 with the widths of the short sides of the quartz crystal blank 110. At least one of the coupling members 111a and 111b has a portion whose thickness is smaller than a region of the quartz crystal blank 110 where the excitation electrode 130 and the excitation electrode 140 face each other. Thus, the quartz crystal resonator 100 (500, 600) need not have through portions at both end portions of the quartz crystal blank 110 in the Z'-axis direction. Therefore, for example, it is possible to provide an appropriate area to the quartz crystal blank 110, compared with the conventional structure. Moreover, because the coupling members 111a and 111b have portions whose thicknesses are smaller than the thickness of the quartz crystal blank 110, vibration can be confined in the quartz crystal blank 110. Accordingly, the size of the quartz crystal resonator can be reduced while suppressing deterioration of vibration characteristics. Furthermore, because the coupling members 111a and 111b are coupled to the frame body 120 with the widths of the short sides of the quartz crystal blank 110, strength against impact from the outside is improved, compared with the conventional structure.

In the quartz crystal resonator 600, the quartz crystal blank 610 includes the middle portion 615 and the peripheral portion 617 that is located around the middle portion 615. As shown, the thickness of the middle portion 615 is larger than the thickness of the peripheral portion 617, and at least one of the coupling members 611a and 611b has a portion whose thickness is smaller than the thickness of the peripheral portion 617 of the quartz crystal blank 610. Because the quartz crystal blank 610 has a mesa shape as described above, the strength of confinement of vibration is increased compared with the quartz crystal resonator 100, and vibration characteristics are improved.

The quartz crystal resonator 100 (500, 600) includes the extension electrodes 132 and 142 that are respectively electrically connected to the excitation electrodes 130 and 140 and that extend to reach outer side surfaces of the frame body 120 via the coupling members 111a and 111b. Thus, without forming via electrodes, the excitation electrodes 130 and 140 can be electrically connected to outer electrodes. Accordingly, the connection reliability of a product is improved, compared with a structure having via electrodes.

In the quartz crystal resonator 100 (500, 600), the lower surface 118a of the coupling member 111a has an inclined portion that is inclined in the upward direction with respect to the main surface 114 from the quartz crystal blank 110 toward the frame body 120, and the upper surface 116b of the coupling member 111b has an inclined portion that is inclined in the downward direction with respect to the main surface 112 from the quartz crystal blank 110 toward the frame body 120. Thus, the thicknesses of the quartz crystal blank 110 and the coupling members 111a and 111b and the thicknesses of the coupling members 111a and 111b and the frame body 120 differ from each other at the boundaries therebetween. Accordingly, leakage of vibration of the quartz crystal blank 110 to the frame body 120 via the coupling members 111a and 111b is suppressed.

It is noted that the shapes of the upper surface 116a of the coupling member 111a and the lower surface 118b of the coupling member 111b are not particularly limited. For example, the upper surface 116a of the coupling member 111a may have an inclined portion that is inclined in the upward direction with respect to the main surface 112 from the quartz crystal blank 110 toward the frame body 120 and that extends to reach the upper surface 122 of the frame body 120, and the lower surface 118b of the coupling member 111b may have an inclined portion that is inclined in the downward direction with respect to the main surface 114 from the quartz crystal blank 110 toward the frame body 120 and that extends to reach the lower surface 124 of the frame body 120.

In the quartz crystal resonator 100 (600), the inclination angle of a portion of the upper surface 116a of the coupling member 111a near the boundary with the quartz crystal blank 110 is smaller than the inclination angle of a portion of the lower surface 118a of the coupling member 111a near the boundary with the quartz crystal blank 110; the inclination angle of a portion of the lower surface 118b of the coupling member 111b near the boundary with the quartz crystal blank 110 is smaller than the inclination angle of a portion of the upper surface 116b of the coupling member 111b near the boundary with the quartz crystal blank 110; the extension electrode 132 extends via the upper surface 116a of the coupling member 111a to reach an outer side surface of the frame body 120 in the Z'-axis direction on the upper surface side; and the extension electrode 142 extends via the lower surface 118b of the coupling member 111b to reach an outer side surface of the frame body 120 in the Z'-axis direction on the lower surface side. Thus, the extension electrodes 132 and 142 are prevented from extending at right angles. Accordingly, it is possible to reduce the probability of breakage of the extension electrodes due to thermal contraction or stress concentration.

Moreover, the thickness of the frame body is not particularly limited. For example, the thickness of the frame body 120 may be equal to or larger than the thickness of the region of the quartz crystal blank 110 where the excitation electrode 130 and the excitation electrode 140 face each other. The lower surface 118a of the coupling member 111a and the upper surface 116b of the coupling member 111b may be, for example, perpendicularly connected to the inner side surface of the frame body 120.

As described herein, the quartz crystal resonator 100 (500, 600) includes the quartz crystal blank 110, the excitation electrodes 130 and 140, the frame body 120 that surrounds the quartz crystal blank 110, and the coupling members 111a and 111b that couple the quartz crystal blank 110 and the frame body 120 to each other. The coupling members 111a and 111b extend from the quartz crystal blank 110 to the frame body 120 with the widths of the short sides of the quartz crystal blank 110. Between both end portions of the quartz crystal blank 110 in the X-axis direction and the frame body 120, the through portions 113a and 113b are formed so as to each extend over the length of the quartz crystal blank 110 and the coupling members 111a and 111b in the Z'-axis direction. The upper surface and the lower surface of the coupling member 111a have inclined surfaces that are inclined upward from the quartz crystal blank 110 toward the frame body 120. The upper surface and the lower surface of the coupling member 111b have inclined surfaces that are inclined downward from the quartz crystal blank 110 toward the frame body 120. Thus, because the quartz crystal resonator 100 (500, 600) need not have through portions at both end portions of the quartz crystal blank 110 in the Z'-axis direction, for example, it is possible to provide an appropriate area to the quartz crystal blank 110, compared with the conventional structure. Moreover, because the upper surface and the lower surface of the coupling members 111a and 111b have the inclined portions, the coupling members 111a and 111b have portions whose thicknesses are smaller than the thickness of the quartz crystal blank 110, and therefore vibration can be confined in the quartz crystal blank 110. Accordingly, the size of the quartz crystal resonator unit can be reduced while suppressing deterioration of vibration characteristics. Furthermore, because the coupling members 111a and 111b are connected to the frame body 120 with the widths of the short sides of the quartz crystal blank 110, strength against impact from the outside is improved, compared with the conventional structure.

It is also noted that the shapes of the coupling members are not particularly limited. For example, the upper surface and the lower surface of each of the coupling members 111a and 111b may each have a curved shape. To be specific, for example, the inclined portion of the upper surface 116a of the coupling member 111a may have a curved shape that is recessed downward, the inclined portion of the lower surface 118a of the coupling member 111a may have a curved shape that is recessed upward, the inclined portion of the upper surface 116b of the coupling member 111b may have a curved shape that is recessed downward, and the inclined portion of the lower surface 118b of the coupling member 111b may have a curved shape that is recessed upward.

The quartz crystal resonator 100 (500, 600) is made of an AT-cut quartz crystal, the long sides of the quartz crystal blank 110 are parallel to the Z'-axis, the short sides are parallel to the X-axis, and the thickness is parallel to the Y'-axis. Thus, by forming the quartz crystal resonator 100 (500, 600) by wet etching, the through portions 113a and 113b and the coupling members 111a and 111b can be formed by using the anisotropy of etching. Accordingly, the quartz crystal resonator 100 (500, 600) can be formed by a simple manufacturing process as described herein.

In the quartz crystal resonator 100 (500, 600), $L1 < Hc/\tan\theta$ and $L2 < Hc/\tan\theta$ are satisfied, where $L1$ is the length of the coupling member 111a in the Z'-axis direction, $L2$ is the length of the coupling member 111b in the Z'-axis direction, $Hc$ is the thickness of a region of the quartz crystal blank 110 where the excitation electrode 130 and the excitation electrode 140 face each other, and $\theta$ is the cut angle of the quartz crystal resonator. Thus, the size of the quartz crystal resonator can be reduced while providing an appropriate area to the quartz crystal blank 110.

The quartz crystal resonator unit 1 includes, for example, the quartz crystal resonator 100 (500, 600), and the lid member 200 and the base member 300 that are joined to the frame body 120. Thus, the quartz crystal blank 110 and the coupling members 111a and 111b are sealed in a space.

The quartz crystal resonator unit 1 further includes the outer electrodes 410, 420, 430, and 440 that are formed on end surfaces of the quartz crystal resonator 100 (500, 600) and the base member 300 and each of which is electrically connected to a corresponding one of the excitation electrodes 130 and 140. Thus, the quartz crystal resonator unit 1 can be electrically connected to the outside and can have mountability.

In the quartz crystal resonator unit 1, the lid member 200 and the base member 300 are each made of an AT-cut quartz crystal. Thus, it is possible to directly join the base member 300, the quartz crystal resonator 100 (500, 600), and the lid member 200 to each other without using a joining member, such as an adhesive or a glass joining material.

As described herein a method of manufacturing a quartz crystal resonator 100 (500, 600) is provided that includes (a) preparing a first substrate made of an AT-cut quartz crystal; (b) forming, by wet etching the first substrate, the quartz crystal blank 110 that has the main surfaces 112 and 114 facing each other, the frame body 120 that surrounds the quartz crystal blank 110, and the coupling members 111a and 111b that couple the quartz crystal blank 110 and the frame body 120 to each other at both end portions of the quartz crystal blank 110 in the Z'-axis direction; and (c) forming the excitation electrode 130 on the main surface 112 and forming the excitation electrode 140 on the main surface 114. Moreover, step (b) includes separating both end portions of the quartz crystal blank 110 in the X-axis direction from the frame body 120, extending the coupling members 111a and 111b from a pair of short sides of the quartz crystal blank 110 with the widths of the short sides to reach the frame body 120, and making the thickness of at least a portion of at least one of the coupling members 111a and 111b smaller than the thickness of a region of the quartz crystal blank 110 where the excitation electrode 130 and the excitation electrode 140 face each other. Thus, it is possible to form the through portions 113a and 113b and the coupling members 111a and 111b by using the anisotropy of etching. Accordingly, the quartz crystal resonator 100 (500, 600) can be formed with a simple manufacturing process.

In the quartz crystal resonator 100 (500, 600), the coupling members 111a and 111b each have an upper surface and a lower surface; and in (b), by wet etching the first substrate, an inclined portion is formed in the lower surface 118a of the coupling member 111a, the inclined portion being inclined in the upward direction with respect to the main surface 114 from the quartz crystal blank 110 toward the frame body 120, and an inclined portion is formed in the upper surface 116b of the coupling member 111b, the inclined portion being inclined in the downward direction with respect to the main surface 112 from the quartz crystal blank 110 toward the frame body 120. Thus, by using the anisotropy of etching, it is possible to make the thicknesses of the quartz crystal blank 110 and the coupling members 111a and 111b differ from the thicknesses of the coupling members 111a and 111b and the frame body 120 at the boundaries therebetween. Accordingly, leakage of vibration of the quartz crystal blank 110 to the frame body 120 via the coupling members 111a and 111b is suppressed.

In the quartz crystal resonator 100 (500, 600), the frame body 120 may have the upper surface 122 and the lower surface 124; and, for example, in step (b), by wet etching the first substrate, an inclined portion may be formed in the upper surface 116a of the coupling member 111a, the inclined portion being inclined in the upward direction with respect to the main surface 112 from the quartz crystal blank 110 toward the frame body 120 and extending to reach the upper surface 122 of the frame body 120, and an inclined portion may be formed in the lower surface 118b of the coupling member 111b, the inclined portion being inclined in the downward direction with respect to the main surface 114 from the quartz crystal blank 110 toward the frame body 120 and extending to reach the lower surface of the frame body 120.

In step (b), an inclination angle of a portion of the upper surface 116a of the coupling member 111a near the boundary with the quartz crystal blank 110 is made smaller than an inclination angle of a portion of the lower surface 118a of the coupling member 111a near the boundary with the quartz crystal blank 110, and an inclination angle of a portion of the lower surface 118b of the coupling member 111b near the boundary with the quartz crystal blank 110 is made smaller than an inclination angle of a portion of the upper surface 116b of the coupling member 111b near the boundary with the quartz crystal blank 110; and (c) further includes forming the extension electrode 132 that is electrically connected to the excitation electrode 130 and that extends via the upper surface 116a of the coupling member 111a to reach an outer side surface of the frame body 120 in the Z'-axis direction on the upper surface side, and forming the extension electrode 142 that is electrically connected to the excitation electrode 140 and that extends via the lower surface 118b of the coupling member 111b to reach an outer side surface of the frame body 120 in the Z'-axis direction on the lower surface side. Thus, the extension electrodes 132 and 142 are prevented from extending at right angles. Accordingly, the probability of breakage of the extension electrode due to thermal contraction and stress concentration can be reduced.

As described herein, a method of manufacturing a quartz crystal resonator 100 (500, 600) is provided that includes (a) preparing a first substrate made of an AT-cut quartz crystal; (b) forming, by wet etching the first substrate, the quartz crystal blank 110 that has the main surfaces 112 and 114 facing each other, the frame body 120 that surrounds the quartz crystal blank 110, the coupling members 111a and 111b that couple the quartz crystal blank 110 and the frame body 120 to each other at both end portions of the quartz crystal blank 110 in the Z'-axis direction, the through portions 113a and 113b that are formed between both end portions of the quartz crystal blank 110 in the X-axis direction and the frame body 120 over a length of the quartz crystal blank 110 and the coupling members 111a and 111b in the Z'-axis direction; and (c) forming the excitation electrode 130 on the main surface 112 and forming the excitation electrode 140 on the main surface 114. In step (b), the main surfaces 112 and 114 are located between the upper surface 122 and the lower surface 124 of the frame body 120 in the Y'-axis direction, inclined surfaces are formed on the upper surface 116a and the lower surface 118a of the coupling member 111a, the inclined surfaces extending from the quartz crystal blank 110 toward the frame body 120 upward in the Y'-axis direction, and inclined surfaces are formed on the upper surface 116b and the lower surface 118b of the coupling member 111b, the inclined surfaces extending from the quartz crystal blank 110 toward the frame body 120 downward in the Y'-axis direction. Thus, it is possible to form the through portions 113a and 113b and the coupling members 111a and 111b by using the anisotropy of etching. Accordingly, the quartz crystal resonator 100 (500, 600) can be formed with a simple manufacturing process.

Moreover, a method of manufacturing the quartz crystal resonator unit 1 is provided that includes, for example, the method of manufacturing the quartz crystal resonator 100 (500, 600), (d) preparing a second substrate for forming the lid member 200, (e) preparing a third substrate for forming the base member 300, (f) joining the first substrate and the second substrate to each other in such a way that the lid member 200 is joined to the frame body 120 on the excitation electrode 130 side, and (g) joining the first substrate and the third substrate to each other in such a way that the base member 300 is joined to the frame body 120 on the excitation electrode 140 side.

In each of the embodiments described above, as an example of a quartz crystal resonator that is AT-cut, a quartz crystal resonator in which a quartz crystal blank has long sides that are parallel to the Z'-axis and short sides that are parallel to the X-axis has been described. However, it is noted that the exemplary embodiments are not limited to this. For example, an AT-cut quartz crystal resonator having short sides that are parallel to the Z'-axis and long sides that are parallel to the X-axis may be used. Alternatively, a quartz crystal resonator including a quartz crystal substrate that is not AT-cut but is, for example, BT-cut may be used.

The exemplary embodiments, which have been described above in order to facilitate understanding the present invention, do not limit the scope of the present invention. The present invention may be modified within the spirit and scope thereof and includes the equivalents thereof. That is, a modification of each of the embodiments that is appropriately modified in design by a person having ordinary skill in the art is included in the scope of the present invention as long as the modification has the features of the present invention. For example, elements of each of the embodiments; and the arrangement, the materials, the shapes, and the sizes of the elements are not limited to those described above as examples and may be modified as appropriate. Elements of the embodiments may be used in a combination as long as the combination is technologically feasible, and such combination is also included in the scope of the present invention as long as the combination has the features of the present invention.

REFERENCE SIGNS LIST 1 quartz crystal resonator unit
100, 500, 600 quartz crystal resonator
110, 610 quartz crystal blank
111a, 111b, 611a, 611b coupling member
113a, 113b through portion
120 frame body
130, 140, 630, 640 excitation electrode
132, 142, 532, 542, 632, 642 extension electrode
200 lid member
300 base member
410, 420, 430, 440 outer electrode

The invention claimed is:

1. A method of manufacturing a quartz crystal resonator, comprising:
preparing a first substrate from a quartz crystal that is AT-cut, such that, when an X-axis, a Y-axis, and a Z-axis are crystal axes of the quartz crystal and a Y'-axis and a Z'-axis are respectively axes by rotating the Y-axis and the Z-axis around the X-axis by a predetermined angle in a direction from the Y-axis toward the Z-axis, surfaces of the quartz crystal that are defined by the X-axis and the Z'-axis are main surfaces;
forming, by wet etching the first substrate:
a body having first and second main surfaces that face each other and that include, in a plan view of the first or second main surfaces, a pair of long sides that extend in the Z'-axis direction and a pair of short sides that extend in the X-axis direction,
a frame that surrounds the body, and
first and second coupling portions that couple the body to the frame at respective ends of the body in the Z'-axis direction; and
forming a first excitation electrode on the first main surface and a second excitation electrode on the second main surface that faces the first excitation electrode,
wherein the wet etching of the first substrate includes:
separating both ends of the body in the X-axis direction from the frame,
extending the first coupling portion in the Z'-axis direction from one of the pair of short sides of the body with a width of the short side to reach the frame,
extending the second coupling portion in the Z'-axis direction from the other of the pair of short sides of the body with a width of the short side to reach the frame, and
making a thickness in the Y'-axis direction of at least a portion of at least one of the first and second coupling portions smaller than a thickness in the Y'-axis direction of a region of the body where the first and second excitation electrodes face each other.

2. The method of manufacturing a quartz crystal resonator according to claim 1,
wherein the first and second coupling portions each have an upper surface on a side of the first main surface and a lower surface on a side of the second main surface, and
wherein the wet etching of the first substrate comprises:
forming an inclined portion in the lower surface of the first coupling portion that is inclined in an upward direction with respect to the second main surface from the body towards the frame, and
forming an inclined portion in the upper surface of the second coupling portion that is inclined in a downward direction with respect to the first main surface from the body towards the frame.

3. The method of manufacturing a quartz crystal resonator according to claim 2,
wherein the frame has an upper surface on the side of the first main surface of the body and a lower surface on the side of the second main surface of the body, and
wherein the wet etching of the first substrate further comprises:
forming an inclined portion in the upper surface of the first coupling portion that is inclined in the upward direction with respect to the first main surface from the body towards the frame and that extends to the upper surface of the frame, and
forming an inclined portion in the lower surface of the second coupling portion that is inclined in the downward direction with respect to the second main surface from the body towards the frame and that extends to the lower surface of the frame.

4. The method of manufacturing a quartz crystal resonator according to claim 3, wherein, the wet etching of the first substrate further comprises:
forming an inclination angle of a portion of the upper surface of the first coupling portion that is connected to a first short side of the body smaller than an inclination angle of a portion of the lower surface of the first coupling portion that is connected to the first short side of the body; and
forming an inclination angle of a portion of the lower surface of the second coupling portion that is connected to a second short side of the body smaller than an inclination angle of a portion of the upper surface of the second coupling portion that is connected to the second short side of the body.

5. The method of manufacturing a quartz crystal resonator according to claim 4, wherein the forming of the first and second excitation electrodes further comprises:
forming a first extension electrode that is electrically connected to the first excitation electrode and that extends via the upper surface of the first coupling portion to a first outer side surface of the frame in the Z'-axis direction on the upper surface side; and
forming a second extension electrode that is electrically connected to the second excitation electrode and that extends via the lower surface of the second coupling portion to a second outer side surface of the frame in the Z'-axis direction on the lower surface side.

6. The method of manufacturing a quartz crystal resonator according to claim 1, wherein $L1 < Hc/\tan\theta$ and $L2 < Hc/\tan\theta$ are satisfied, where L1 is a length of the first coupling portion in the Z'-axis direction, L2 is a length of the second coupling portion in the Z'-axis direction, Hc is a length in the Y'-axis direction of the region of the body where the first excitation electrode faces the second excitation electrode, and $\theta$ is a cut angle of the quartz crystal resonator.

7. The method of manufacturing a quartz crystal resonator according to claim 1, wherein the forming of the body, by wet etching the first substrate, comprises forming the body to include a middle portion that includes a center in the Z'-axis direction and the X-axis direction and a peripheral portion that is located around the middle portion in the plan view of the first or second main surfaces, such that the middle portion has a thickness in the Y'-axis direction that is larger than a thickness of the peripheral portion in the Y'-axis direction, and at least a portion of at least one of the first and second coupling portions has a thickness smaller than the thickness of the peripheral portion of the body in the Y'-axis direction.

8. The method of manufacturing a quartz crystal resonator according to claim 2, wherein the forming of the frame, by wet etching the first substrate, comprises forming the frame to have a thickness in the Y'-axis direction that is equal to or larger than the thickness of the region of the body where the first excitation electrode and the second excitation electrode face each other, with the upper surface of the first coupling portion being perpendicularly connected to an inner side surface of the frame, and the lower surface of the second coupling portion being perpendicularly connected to the inner side surface of the frame.

9. A method of manufacturing a quartz crystal resonator unit, comprising:
    manufacturing a quartz crystal resonator according to claim 1;
    preparing a second substrate for forming a lid;
    preparing a third substrate for forming a base;
    joining the first substrate to the second substrate such that the lid is joined to the frame on a side of the first excitation electrode; and
    joining the first substrate to the third substrate such that the base is joined to the frame on a side of the second excitation electrode.

10. A method of manufacturing a quartz crystal resonator, comprising:
    preparing a first substrate from a quartz crystal that is AT-cut, such that, when an X-axis, a Y-axis, and a Z-axis are crystal axes of the quartz crystal and a Y'-axis and a Z'-axis are respectively axes by rotating the Y-axis and the Z-axis around the X-axis by a predetermined angle in a direction from the Y-axis toward the Z-axis, surfaces of the quartz crystal that are defined by the X-axis and the Z'-axis are main surfaces;
    forming, by wet etching the first substrate:
        a body having first and second main surfaces that face each other and that include, in a plan view of the first or second main surfaces, a pair of long sides that extend in the Z'-axis direction and a pair of short sides that extend in the X-axis direction,
        a frame that has an inner side surface that surrounds the body and an upper and lower surfaces that are respectively located on an upper side and a lower side in the Y'-axis direction,
        a first coupling portion that extends in the Z'-axis direction so as to couple one of the pair of short sides of the body to the inner side surface of the frame and that has an upper surface and a lower surface that are respectively located on an upper side and a lower side in the Y'-axis direction,
        a second coupling portion that extends in the Z'-axis direction so as to couple the other of the pair of short sides of the body to the inner side surface of the frame and that has an upper surface and a lower surface that are respectively located on an upper side and a lower side in the Y'-axis direction, and
        a first and second through portions between both ends of the body in the X-axis direction and the frame, with the first and second through portions each extending over a length of the body and the first and second coupling portions in the Z' axis direction; and
        forming a first excitation electrode on the first main surface and a second excitation electrode on the second main surface that faces the first excitation electrode,
    wherein the first and second main surfaces are located between the upper surface and the lower surface of the frame in the Y'-axis direction, and
    wherein the wet etching of the first substrate includes:
        forming an inclined portion in each of the upper surface and the lower surface of the first coupling portion that is inclined upward in the Y'-axis direction from the body towards the frame, and
        forming an inclined portion in each of the upper surface and the lower surface of the second coupling portion that is inclined downward in the Y'-axis direction from the body towards the frame.

11. The method of manufacturing a quartz crystal resonator according to claim 10, wherein the wet etching of the first substrate further comprises forming the first and second coupling portions to each comprise a width extending in the second direction that is substantially a same width as the respective pair of short sides of the body.

12. The method of manufacturing a quartz crystal resonator according to claim 10, wherein the wet etching of the first substrate includes making a thickness in the Y'-axis direction of at least a portion of at least one of the first and second coupling portions smaller than a thickness in the Y'-axis direction of a region of the body where the first and second excitation electrodes face each other.

13. The method of manufacturing a quartz crystal resonator according to claim 10, wherein the forming of the first and second excitation electrodes further comprises:
    forming a first extension electrode that is electrically connected to the first excitation electrode and that extends via the upper surface of the first coupling portion to a first outer side surface of the frame in the Z'-axis direction; and
    forming a second extension electrode that is electrically connected to the second excitation electrode and that extends via the lower surface of the second coupling portion to a second outer side surface of the frame in the Z'-axis direction.

14. The method of manufacturing a quartz crystal resonator according to claim 10, wherein the forming of the body, by wet etching the first substrate, comprises forming the body to include a middle portion that includes a center in the Z'-axis direction and the X-axis direction and a peripheral portion that is located around the middle portion in the plan view of the first or second main surfaces, such that the middle portion has a thickness in the Y'-axis direction that is larger than a thickness of the peripheral portion in the Y'-axis direction, and at least a portion of at least one of the first and second coupling portions has a thickness smaller than the thickness of the peripheral portion of the body in the Y'-axis direction.

15. A method of manufacturing a quartz crystal resonator unit, comprising:
    manufacturing a quartz crystal resonator according to claim 10;
    preparing a second substrate for forming a lid;
    preparing a third substrate for forming a base;
    joining the first substrate to the second substrate such that the lid is joined to the frame on a side of the first excitation electrode; and
    joining the first substrate to the third substrate such that the base is joined to the frame on a side of the second excitation electrode.

16. A method of manufacturing a quartz crystal resonator, comprising:
- wet etching a substrate to form:
  - a body having first and second main surfaces that face each other and that includes a pair of long sides that extend in a first direction and a pair of short sides that extend in a second,
  - a frame that surrounds the body, and
  - first and second coupling portions that couple the body to the frame at respective ends of the body in the first direction; and
- forming a first excitation electrode on the first main surface and a second excitation electrode on the second main surface that faces the first excitation electrode,
- wherein the wet etching of the first substrate includes:
  - separating both ends of the body in the second direction from the frame,
  - extending the first coupling portion in the first direction from one of the pair of short sides of the body to reach the frame, with the first coupling portion having a same width as the respective short side,
  - extending the second coupling portion in the first direction from the other of the pair of short sides of the body to reach the frame, with the second coupling portion having a same width as the respective short side, and
  - making a thickness in a third direction of at least a portion of at least one of the first and second coupling portions smaller than a thickness in the third direction of a region of the body where the first and second excitation electrodes face each other, with the third direction being orthogonal to the first and second main surfaces of the body.

17. The method of manufacturing a quartz crystal resonator according to claim 16, further comprising preparing the substrate from a quartz crystal that is AT-cut, such that, when an X-axis, a Y-axis, and a Z-axis are crystal axes of the quartz crystal and a Y'-axis and a Z'-axis are respectively axes by rotating the Y-axis and the Z-axis around the X-axis by a predetermined angle in a direction from the Y-axis toward the Z-axis, surfaces of the quartz crystal that are defined by the X-axis and the Z'-axis are the first and second main surfaces.

18. The method of manufacturing a quartz crystal resonator according to claim 16,
- wherein the first and second coupling portions each have an upper surface on a side of the first main surface and a lower surface on a side of the second main surface, and
- wherein the wet etching of the substrate comprises:
  - forming an inclined portion in the lower surface of the first coupling portion that is inclined in an upward direction with respect to the second main surface from the body towards the frame; and
  - forming an inclined portion in the upper surface of the second coupling portion that is inclined in a downward direction with respect to the first main surface from the body towards the frame.

19. The method of manufacturing a quartz crystal resonator according to claim 18,
- wherein the frame has an upper surface on the side of the first main surface of the body and a lower surface on the side of the second main surface of the body, and
- wherein the wet etching of the substrate further comprises:
  - forming an inclined portion in the upper surface of the first coupling portion that is inclined in the upward direction with respect to the first main surface from the body towards the frame and that extends to the upper surface of the frame; and
  - forming an inclined portion in the lower surface of the second coupling portion that is inclined in the downward direction with respect to the second main surface from the body towards the frame and that extends to the lower surface of the frame.

20. The method of manufacturing a quartz crystal resonator according to claim 19,
- wherein the wet etching of the substrate further comprises:
  - forming an inclination angle of a portion of the upper surface of the first coupling portion that is connected to a first short side of the body smaller than an inclination angle of a portion of the lower surface of the first coupling portion that is connected to the first short side of the body,
  - forming an inclination angle of a portion of the lower surface of the second coupling portion that is connected to a second short side of the body smaller than an inclination angle of a portion of the upper surface of the second coupling portion that is connected to the second short side of the body, and
- wherein the forming of the first and second excitation electrodes further comprises:
  - forming a first extension electrode that is electrically connected to the first excitation electrode and that extends via the upper surface of the first coupling portion to a first outer side surface of the frame in the first direction on the upper surface side, and
  - forming a second extension electrode that is electrically connected to the second excitation electrode and that extends via the lower surface of the second coupling portion to a second outer side surface of the frame in the first direction on the lower surface side.

* * * * *